(12) United States Patent
Xie et al.

(10) Patent No.: US 12,520,564 B2
(45) Date of Patent: Jan. 6, 2026

(54) OPTIMIZING STRESS IN A HYBRID VERTICAL-PFET AND HORIZONTAL-NFET NANOSHEET STRUCTURE

(71) Applicant: International Business Machines Corporation, Armonk, NY (US)

(72) Inventors: Ruilong Xie, Niskayuna, NY (US); Julien Frougier, Albany, NY (US); Heng Wu, Guilderland, NY (US); Nicolas Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 746 days.

(21) Appl. No.: 17/566,402

(22) Filed: Dec. 30, 2021

(65) Prior Publication Data

US 2023/0215768 A1 Jul. 6, 2023

(51) Int. Cl.
*H10D 84/03* (2025.01)
*H10D 30/62* (2025.01)
*H10D 30/67* (2025.01)
*H10D 62/10* (2025.01)
*H10D 84/01* (2025.01)

(52) U.S. Cl.
CPC ........... *H10D 84/038* (2025.01); *H10D 30/62* (2025.01); *H10D 30/6735* (2025.01); *H10D 62/118* (2025.01); *H10D 84/0167* (2025.01); *H10D 84/0193* (2025.01)

(58) Field of Classification Search
CPC .... H10D 84/038; H10D 30/62; H10D 62/118; H10D 84/0167; H10D 30/6735; H10D 84/0193

See application file for complete search history.

(56) References Cited

U.S. PATENT DOCUMENTS

| 9,741,716 | B1 | 8/2017 | Cheng |
| 9,899,529 | B2 | 2/2018 | Hong |
| 9,941,118 | B2 | 4/2018 | Leobandung |
| 9,947,804 | B1 | 4/2018 | Frougier |
| 10,332,803 | B1* | 6/2019 | Xie ..................... H10D 84/853 |

(Continued)

FOREIGN PATENT DOCUMENTS

| CN | 108298583 A | 7/2018 |
| EP | 3182459 A1 | 6/2017 |

OTHER PUBLICATIONS

Zhang, J., Frougier, J., Greene, A., Miao, X., Yu, L., Vega, R., . . . & Bu, H. (2019, December). Full Bottom Dielectric Isolation to Enable Stacked Nanosheet Transistor for Low Power and High Performance Applications. In 2019 IEEE International Electron Devices Meeting (IEDM) (pp. 1-5). IEEE.

*Primary Examiner* — Christine A Enad
(74) *Attorney, Agent, or Firm* — Samuel Waldbaum; Otterstedt & Kammer PLLC

(57) ABSTRACT

An exemplary semiconductor apparatus includes a substrate that includes a first semiconductor. The substrate includes a main body and first and second island portions protruding upward from the main body. The apparatus also includes a bottom dielectric isolation layer that covers the substrate; a PFET with a plurality of gate-all-around (GAA) vertical channel fins above the first island portion and the bottom dielectric isolation layer; and an NFET with a plurality of gate-all-around (GAA) horizontal nanosheet layers above the second island portion and the bottom dielectric isolation layer.

10 Claims, 24 Drawing Sheets

(56) References Cited

U.S. PATENT DOCUMENTS

| | | |
|---|---|---|
| 10,832,916 B1 | 11/2020 | Xie |
| 2017/0162671 A1* | 6/2017 | Basker ................ H10D 84/834 |
| 2019/0109052 A1* | 4/2019 | Reznicek ............. H10D 84/853 |
| 2019/0326286 A1 | 10/2019 | Xie et al. |
| 2020/0312726 A1 | 10/2020 | Veloso |
| 2021/0134795 A1* | 5/2021 | Ju ....................... H10D 64/518 |
| 2021/0193797 A1 | 6/2021 | Xie |
| 2021/0273049 A1* | 9/2021 | Wu ..................... H10D 84/0158 |
| 2023/0058459 A1* | 2/2023 | More ................... H10D 30/014 |

* cited by examiner

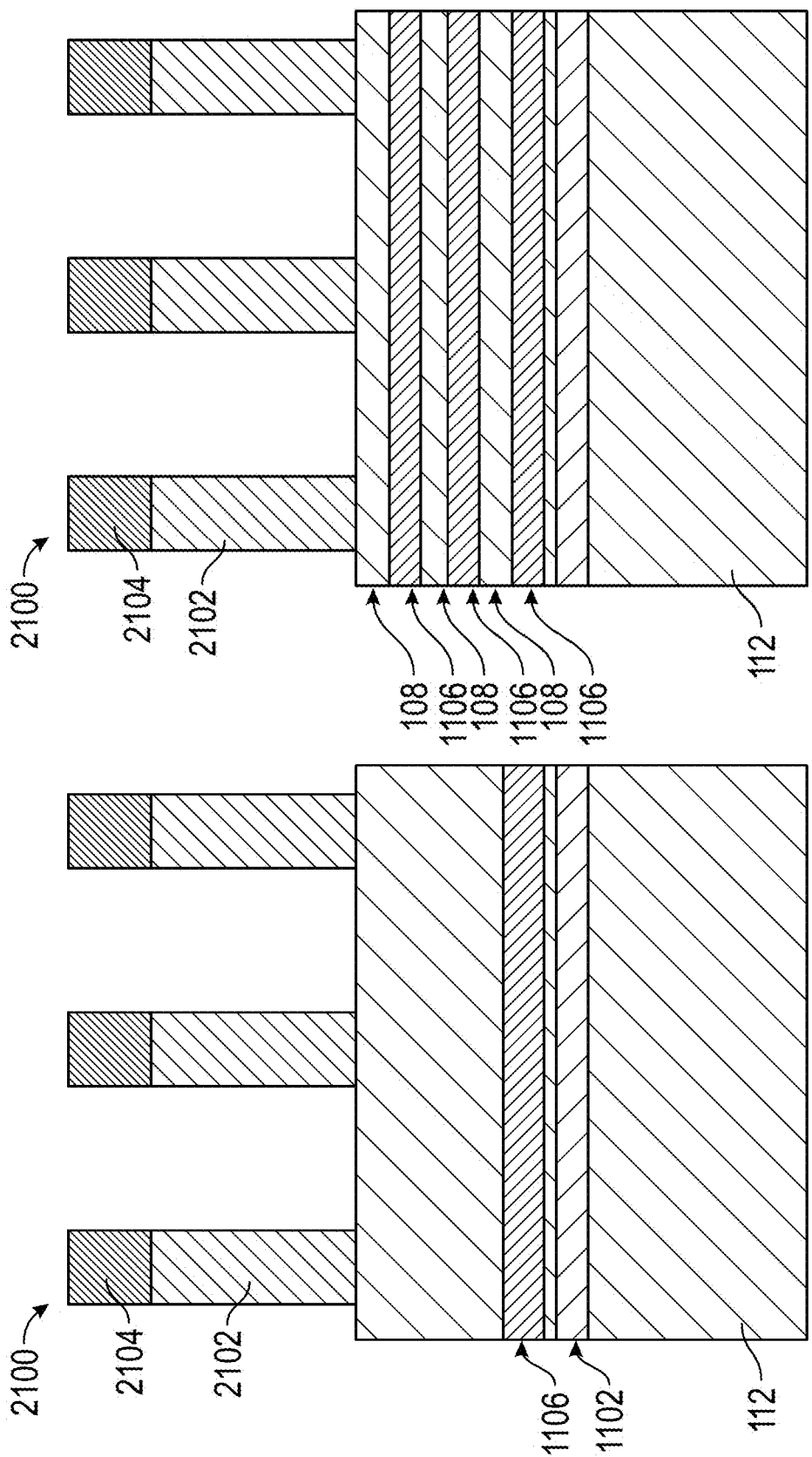

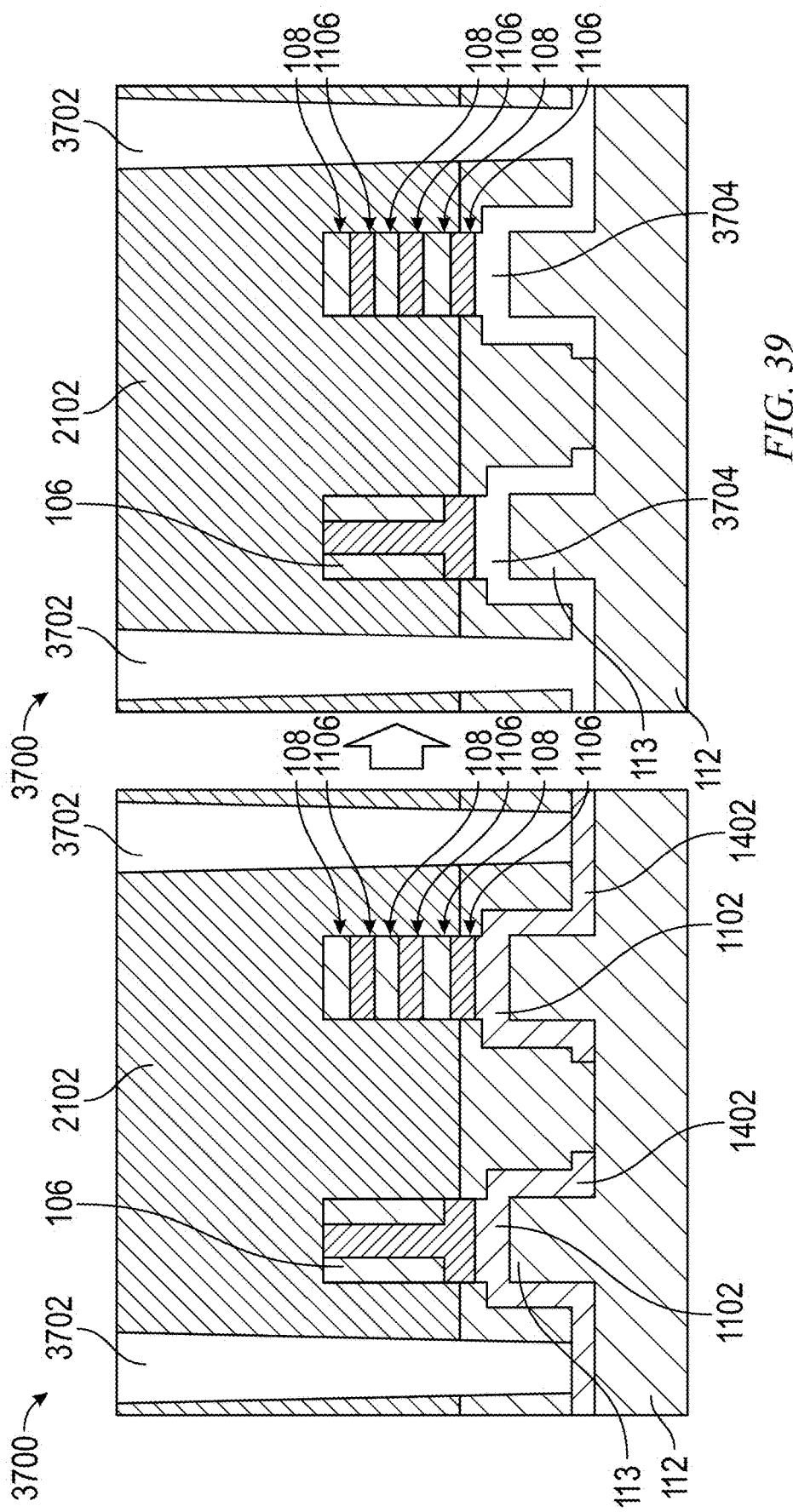

OPTIMIZING STRESS IN A HYBRID VERTICAL-PFET AND HORIZONTAL-NFET NANOSHEET STRUCTURE

BACKGROUND

The present invention relates to the electrical, electronic, and computer arts, and more specifically, to fabrication of field effect transistors.

In forming a field effect transistor, it is desirable, when possible, to grow the semiconductor structures (e.g., channel, source, and drain) epitaxially from a substrate so that there are few crystal defects to reduce the source/drain epitaxy resistance and improve the source/drain epitaxy stress to the channel. In addition, it is also desirable to form channel regions of the transistors with surface orientation that is favorable to holes or electrons depending on the device type. It is particularly helpful for p-type channel surface orientation to be (110) and n-type channel surface orientation to be (100) to maximize the channel mobility.

It also is desirable to electrically isolate source/drain structures and channels from the substrate so that there is little or no leakage current (undesired flow of charge carriers when the transistor is supposed to be non-conducting).

Generally, imposing a dielectric isolator onto the substrate (so as to mitigate or eliminate leakage current) renders it impossible to epitaxially grow further structures (such as source/drain structures) from the substrate.

SUMMARY

Principles of the invention provide techniques for optimizing stress in a hybrid vertical-pFET (p-type field effect transistor) and horizontal-nFET (n-type field effect transistor) nanosheet structure.

In one aspect, an exemplary semiconductor apparatus includes a substrate that includes a first semiconductor. The substrate includes a main body and first and second island portions protruding upward from the main body. The apparatus also includes a bottom dielectric isolation layer that covers the substrate; a PFET with a plurality of gate-all-around (GAA) vertical channel fins above the first island portion and the bottom dielectric isolation layer; and an NFET with a plurality of gate-all-around (GAA) horizontal nanosheet layers above the second island portion and the bottom dielectric isolation layer.

According to another aspect, an exemplary semiconductor apparatus includes a substrate that includes a first semiconductor. The substrate includes a main body and an island portion protruding upward from the main body. The apparatus also includes a bottom dielectric isolation layer overlying the substrate; and a first source/drain structure above the bottom dielectric isolation layer. The first source/drain structure includes a second semiconductor, which has a same crystal structure and orientation as the island portion of the substrate.

According to another aspect, an exemplary method for making a semiconductor structure includes epitaxially growing a stack of nanosheets of a first semiconductor, interleaved with a first sacrificial material, from a layer of a second sacrificial material that covers a second semiconductor substrate. The exemplary method also includes patterning the stack of nanosheets to reveal a region of the second sacrificial material; epitaxially growing a PFET stack of a second semiconductor from the region of the second sacrificial material; forming, from the PFET stack, vertical PFET fins that are separated by the first sacrificial material from each other and from a base layer of the first semiconductor; forming a dummy gate around the PFET fins; forming inner spacers by indenting the first sacrificial material; epitaxially growing a silicon buffer, using the base layer as nucleation; epitaxially growing, from the silicon buffer, a source/drain structure (p-S/D), which contacts ends of the PFET fins; and replacing the second sacrificial material with a bottom dielectric isolator.

In view of the foregoing, techniques of the present invention can provide substantial beneficial technical effects. For example, one or more embodiments provide one or more of:

In a hybrid vertical-pFET and horizontal-nFET nanosheet structure, single-crystal source/drain structures aligned with substrate crystal structure.

In a hybrid vertical-pFET and horizontal-nFET nanosheet structure, bottom dielectric isolation (BDI) islands completely underlying the source/drain structures.

In a hybrid vertical-pFET and horizontal-nFET nanosheet structure, pFET source/drain structures that are laterally strained by epitaxial growth from the substrate.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 11 through FIG. 43 depict, in plan view and in side and front section views, intermediate structures that are produced by steps of the methods shown in FIG. 5 and/or FIG. 10.

DETAILED DESCRIPTION

FIGS. 1-4 depict a hybrid nanosheet structure 100 that includes a vertical-pFET (p-type field effect transistor) 102 and a horizontal-nFET (n-type field effect transistor) 104. The vertical-pFET 102 includes a plurality of fins 106, which are generally vertical in the views of FIG. 2 and FIG. 3, as well as a plurality of p-type source/drain structures (p-S/D) 107 that are electrically connected in communication with the fins 106. The horizontal-nFET 104 includes a plurality of nanosheets 108, which are generally horizontal in the views of FIG. 2 and FIG. 4, as well as a plurality of n-type source/drain structures (n-S/D) 109, which are electrically connected in communication with the nanosheets 108. In one or more embodiments, the p-S/D 107 are of a different composition from the n-S/D 109. For example, the p-S/D 107 comprise a semiconductor doped with a p-type impurity, e.g., SiGe:B, whereas the n-S/D 109 comprise a semiconductor doped with an n-type impurity, e.g., Si:P. Similarly, in one or more embodiments, the fins 106 are of different composition from the nanosheets 108. Further, in one or more embodiments the fins and nanosheets and the p-S/D and the n-S/D are of different composition from a semiconductor substrate 112. However, in one or more embodiments, some or all these components contain at least one semiconductor in common—for example, silicon or germanium. That is, "first," "second," and "third" semiconductors, which are constituents of the S/D, fins, nanosheets, and substrate, are denoted as such purely for convenience of description, and in actuality can be the same or different semiconductors.

Figure 3:
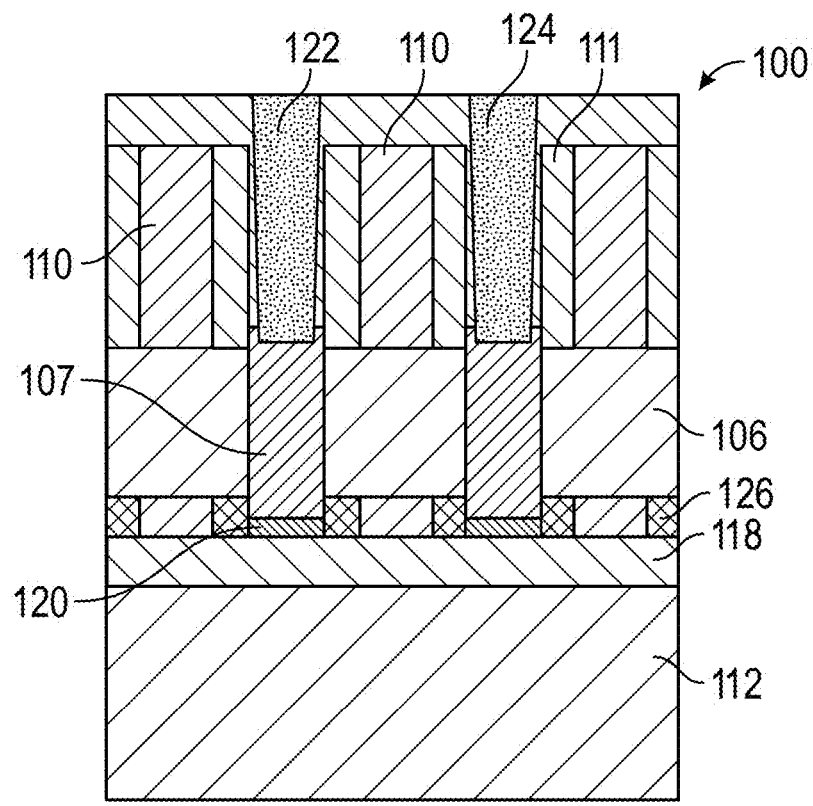
FIG. 3 depicts in a section view the hybrid nanosheet structure shown in FIG. 1, as seen at cutline 3-3.
Figure 4:
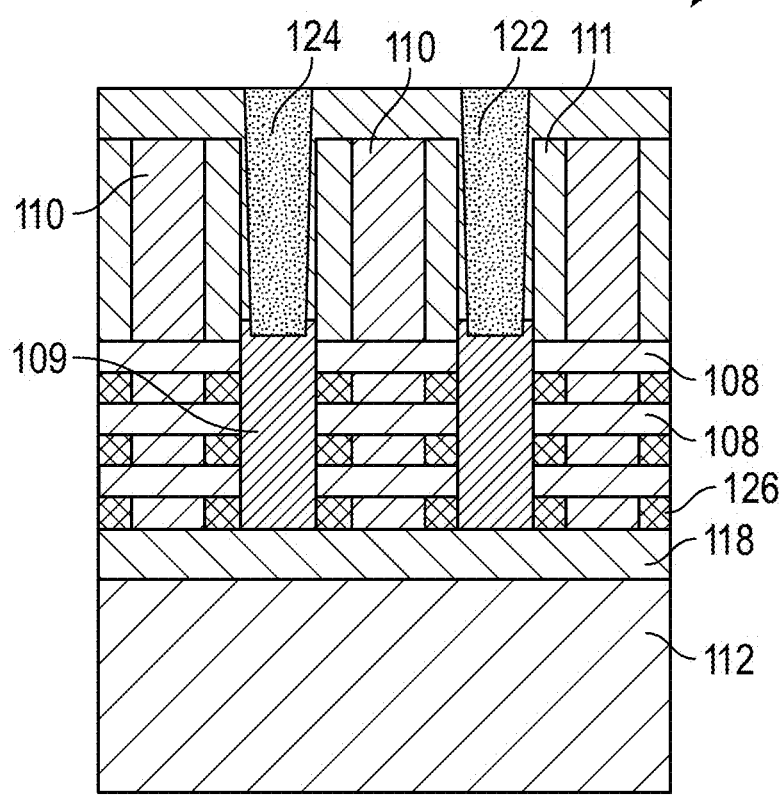
FIG. 4 depicts in a section view the hybrid nanosheet structure shown in FIG. 1, as seen at cutline 4-4.

In FIG. 3 and FIG. 4, a gate stack 110 represents collectively a gate dielectric, a work function metal (WFM), and a conductive gate metal for each field effect transistor (FET) in the complementary metal-oxide-semiconductor (CMOS) structure 100. The skilled worker will appreciate, among other well-known details not specifically discussed, that a WFM for the nFET 104 is different (lower work function) than a WFM for the pFET 102. Spacers 111 separate the gate stack from an interlayer dielectric 116.

Figure 2:
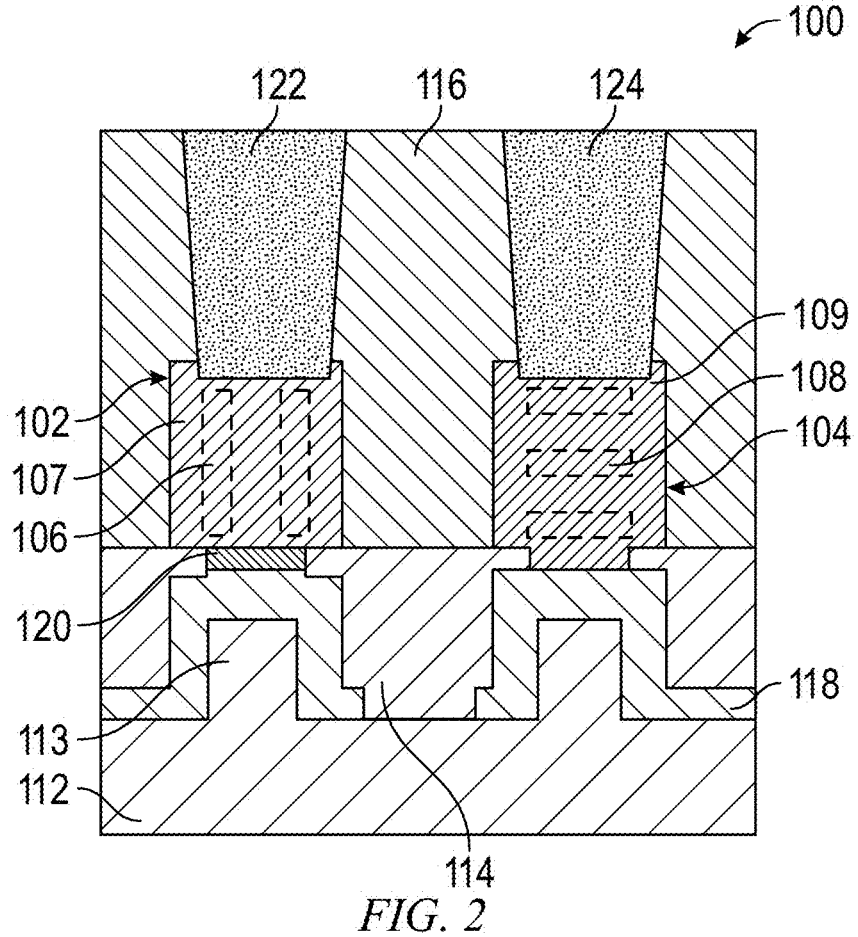
FIG. 2 depicts in a section view the hybrid nanosheet structure shown in FIG. 1, as seen at cutline 2-2.

Referring to FIG. 2 through FIG. 4, the structure 100 is built onto a substrate, which has a main body 112 and a plurality of island portions 113. Shallow trench isolation (STI) 114 and the interlayer dielectric 116 (as seen in FIG. 2) separate the pFET 102 from the nFET 104. Bottom dielectric isolation (BDI) 118 also separates the substrate 112 from the pFET 102 and the nFET 104. Notably, each p-S/D 107 rests on a buffer pad 120 that separates the p-S/D from the BDI 118, and each p-S/D is epitaxially grown from the buffer pad. In one or more embodiments, when the p-S/D comprises a silicon germanium alloy and the buffer pad comprises pure crystalline silicon, epitaxial growth of the p-S/D from the buffer pad advantageously imposes a crystalline strain that improves electrical properties (e.g., hole conductivity) of the p-S/D, which could also generate better strain to the channel region.

Top contacts 122, 124 are electrically connected with the p-S/D 107 and the n-S/D 109. The top contacts comprise conductive material, e.g., a combination of a silicide liner, an adhesion metal liner and a conductive metal. The skilled worker will be aware of appropriate conductive materials for particular applications.

Inner spacers 126 help to separate the gate stacks 110 from the source/drain structures 107, 109.

The substrate 112 comprises a first semiconductor, e.g., silicon.

The fins 106 and the nanosheets 108 comprise a second semiconductor, which in one or more embodiments is the same as the first semiconductor (e.g., silicon). In other embodiments, the second semiconductor is different (e.g., a silicon-germanium alloy) from the first semiconductor. An aspect of the invention is that the fins 106 and nanosheets 108 are grown epitaxially from the substrate 112 (including intervening sacrificial layers, described later with reference to drawing views of intermediate structures during fabrication of the structure 100). In one or more embodiments, because the fins are grown separately from the nanosheets (as will be further explained with reference to FIG. 5), the fins and nanosheets are of different compositions.

In one or more embodiments, STI 114 is formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide/organosilicate glass (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. In one or more embodiments, STI 114 is formed by chemical vapor deposition (CVD) or atomic layer deposition (ALD) followed by chemical mechanical planarization (CMP) and recessing. STI 114 may later be selectively etched down below other features of the structure 100, as further discussed with reference to FIG. 5.

Figure 1:
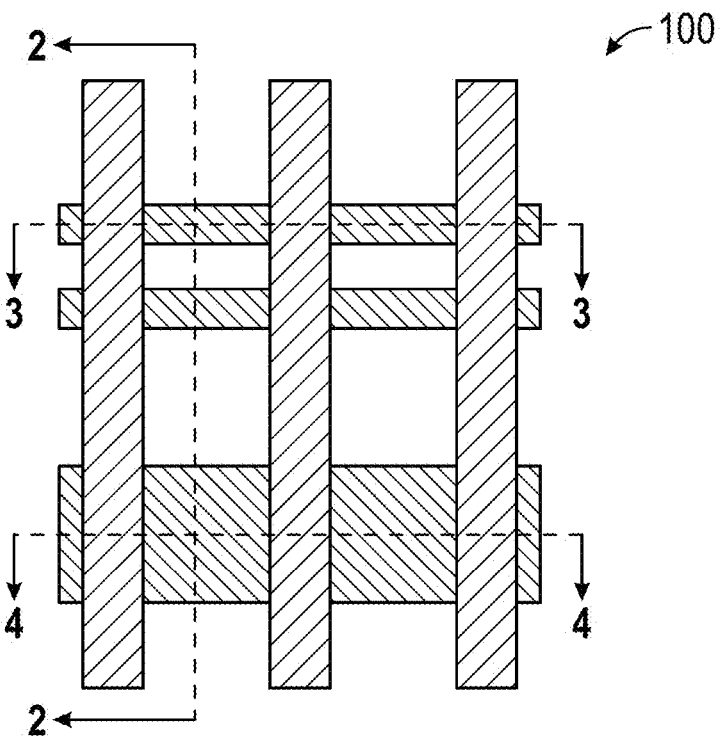
FIG. 1 depicts in a plan view a hybrid nanosheet structure that includes a vertical-pFET (p-type field effect transistor) and a horizontal-nFET (n-type field effect transistor), according to exemplary embodiments.
Figure 5:
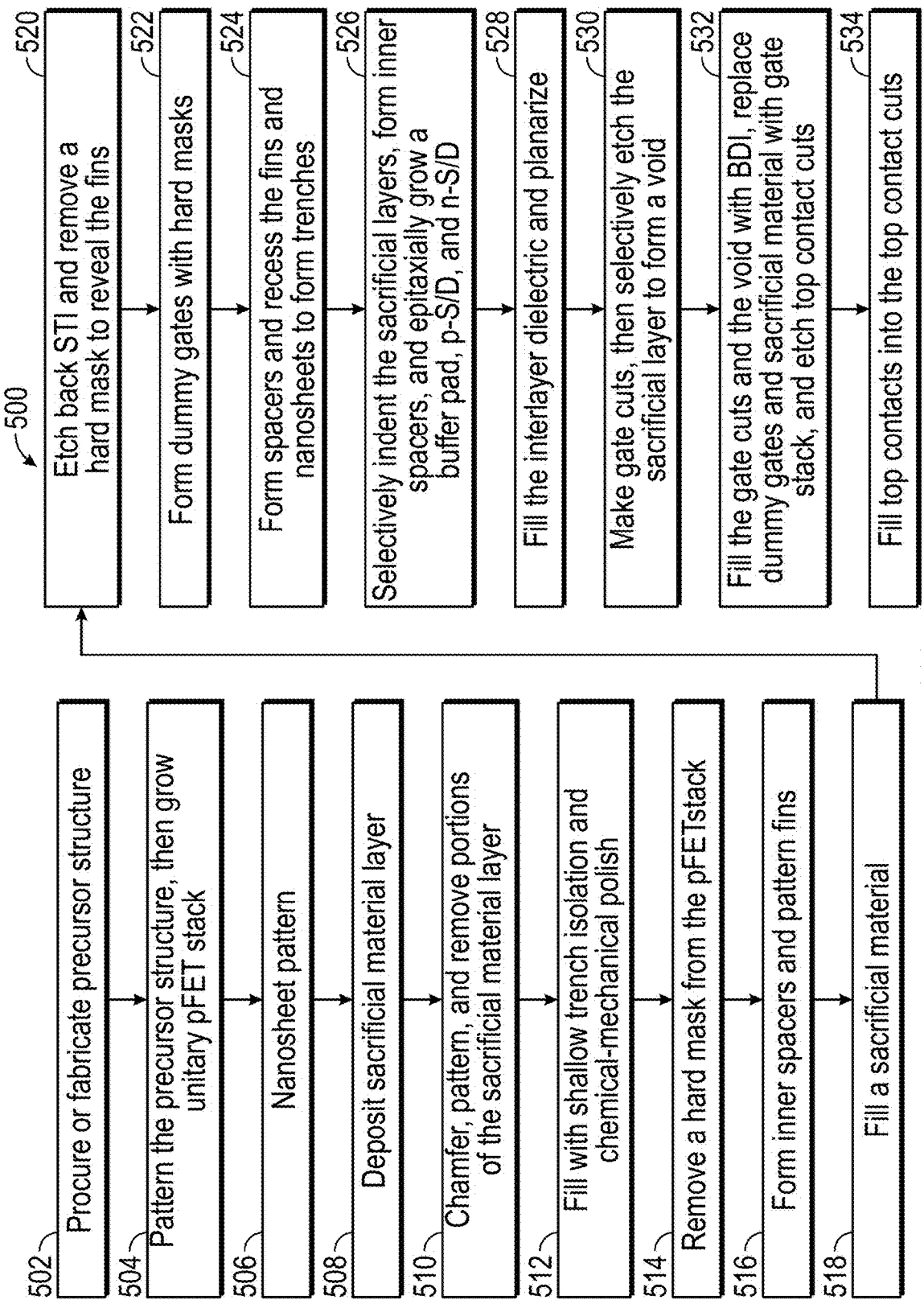
FIG. 5 depicts steps of a method for fabricating the structure shown in FIG. 1.

FIG. 5 depicts steps of a method 500 for fabricating the structure shown in FIG. 1.

Figure 11:
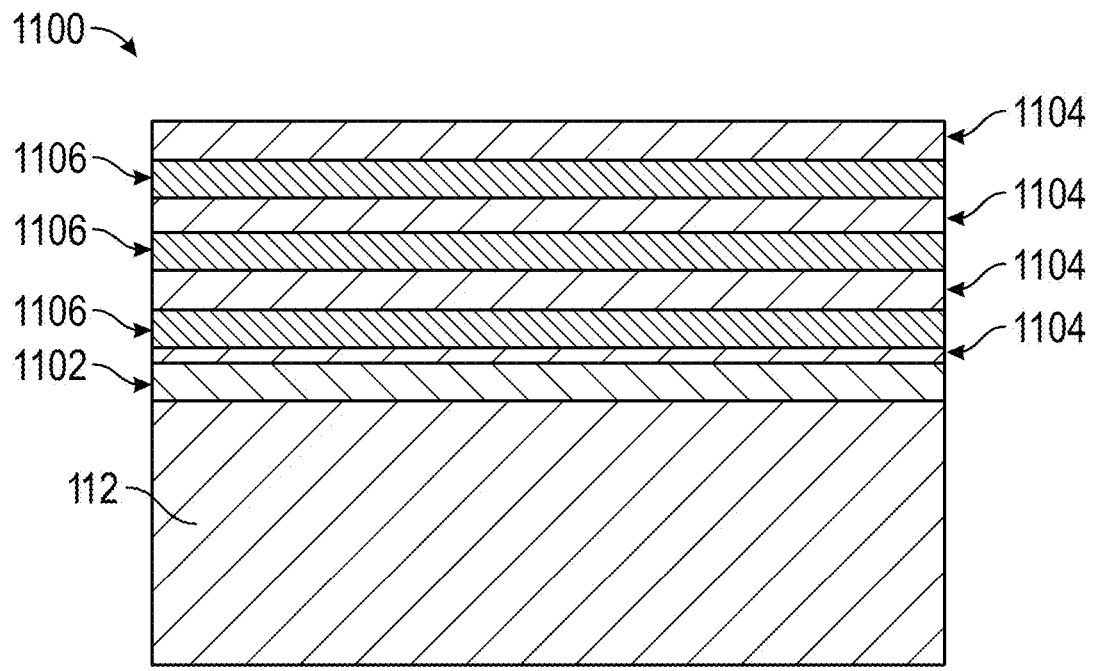

At 502, procure or fabricate a precursor structure 1100, as shown in FIG. 11. FIG. 11 depicts, in side section view, a precursor structure 1100 in the formation of the hybrid structure 100 (shown in FIG. 1 through FIG. 4) or 600 (shown in FIG. 6 through FIG. 9). As described further herein, the precursor structure 1100 undergoes various processes according to embodiments, and is formed into intermediate structures further described with reference to following drawing views. The skilled worker will appreciate that the precursor structure 1100 can be formed from other preliminary structures and/or according to distinct processes. Precursor structure 1100 and processes used to form the precursor structure are merely used for illustrative purposes.

As shown in FIG. 11, precursor structure 1100 includes a plurality of layers, which can be formed sequentially over one another, e.g., via conventional deposition, growth (e.g., epitaxial growth) or other known methods of forming a stack of layers. As shown, the preliminary structure 1100 includes the substrate 112 that finally appears as the base of the structure 100 or 600. As mentioned, the substrate 112 comprises a first semiconductor, which, in one or more embodiments, could include any currently-known or later developed material capable of being processed into a transistor structure, such as a bulk semiconductor layer, a semiconductor-on-insulator (SOI) substrate, etc. In one or more embodiments, the substrate 112 includes one or more sites targeted for transistor formation as described herein. Substrate 112 thus may overlie one or more other layers of material having distinct material and/or electrical properties, with such layers of material being omitted from the accompanying drawing views to better illustrate structures and processes to form the structure 100 or 600, according to embodiments of the disclosure. Substrate 112 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 112 or a portion thereof may be strained.

In one or more embodiments, substrate 112 has one of a variety of configurations, such as a bulk silicon configuration, or such as a silicon-on-insulator (SOI) configuration that includes a bulk silicon layer, a buried insulation layer and an active layer, wherein semiconductor devices are formed in and above the active layer. As noted previously, substrate 112 may be made of silicon or it may be made of materials other than silicon. Thus, the terms "substrate" or "semiconductor substrate" should be understood to cover all semiconducting materials and all forms of such materials. In one or more embodiments, substrate 112 of preliminary structure 100 is formed by forming a semiconductor material on an underlying structure (not shown). For the purposes of example and simplicity, other materials and/or layers positioned beneath substrate 112 have been omitted from the accompanying figures. Substrate 112 may be processed to include trenches, insulating materials, etc., for electrically isolating distinct transistor structures formed from the same substrate 112.

Various materials are referred to herein as being removed or otherwise "etched" according to embodiments. Etching generally refers to the removal of material (e.g., various structures formed above substrate 112, or portions of substrate 112, such as in the formation of a shallow trench isolation (STI), e.g., shallow trench isolation 114 that is shown in FIG. 2), and is often performed with a mask in place so that material may selectively be removed from certain areas of the substrate, while leaving the material unaffected in other areas of the substrate. One example of an etching process may include "dry etching." A dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases that approach the wafer approximately from one direction, and therefore this process is highly anisotropic.

Etchants selective to the composition of sacrificial material (e.g., majority-germanium semiconductor materials or other semiconductor materials discussed herein) may be particularly effective for removing sacrificial materials (e.g., sacrificial nanosheets) while leaving other materials intact. Various forms of selective etching may include, e.g., wet etching. Wet etching is generally performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotropically, but a wet etch may also etch single-crystal materials (e.g. silicon wafers) anisotropically. Additional selective etching processes can include reactive ion etching (RIE), as discussed further herein.

Additionally, insulating or liner materials may be formed surrounding or otherwise insulating (e.g., lining) conductive elements in the structures disclosed herein. Where a liner may be appropriate for use in lining a conductive element, liners can include any currently known or later developed insulating material, e.g., an oxide, nitride, and/or other insulating material. Materials appropriate for the composition of a liner may include, for example, silicon dioxide ($SiO_2$), silicon nitride (SiN), organosilicate glass (SiCOH), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), other silicon and nitride-based materials (e.g., SiBCN, SiNC, SiNOC), organosilicon compounds, and other currently known or later-developed materials having similar properties.

Even further, masks or "masking materials" are described according to various processes herein. In some cases, masks can include an insulator material as noted above. In particular examples, a mask may include an insulator comprising a nitride or oxide material positioned beneath one or more layers of masking material, e.g., a silicon nitride or silicon oxide hard mask. The patterning of a hard mask may be accomplished by any currently known or later developed process of transferring a pattern from a mask or reticle to a photoresist layer deposited on a structure. Lithography processes may include, e.g., self-aligned double patterning (SADP), self-aligned quadruple patterning (SAQP), extreme ultraviolet (EUV) patterning, and/or other single or multiple patterning techniques. The patterning may be followed by ashing to separate the single layer of hard mask into a plurality of smaller structures, such that materials not covered by the mask may be etched.

According to an example, substrate 112 may be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

In addition to deposition, various materials herein are referred to as being grown or epitaxially grown. For example, referring again to FIG. 11, in one or more embodiments, a layer of a first sacrificial material 1102 (e.g., silicon-germanium 60% (SiGe60) or SiGe with Ge % 50~70%), and alternating layers of semiconductor nanosheets 1104 (e.g., silicon) and a second sacrificial material 1106 (e.g., silicon-germanium 25% (SiGe25) or silicon-germanium with Ge % 20~35%), are epitaxially grown on the substrate 112.

In one or more embodiments, the first sacrificial material layer 1102 is between 10-15 nanometers (nm) thick. In one or more embodiments, a semiconductor nanosheet 1104 that is adjacent to the first sacrificial material layer is about 2 nm thick. In one or more embodiments, the other semiconductor nanosheets are about 4-10 nm thick. In one or more embodiments, the sheets of second sacrificial material 1106 are about 8-15 nm thick.

A "sacrificial material" is one that will in a subsequent step be etched away and (possibly) replaced with a different material. "Epitaxy" or "epitaxial growth," as used herein, refers to a process by which a thin layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100}crystal surface may take on a {100}orientation. In some embodiments, epitaxial growth and/or deposition processes are selective to forming on semiconductor surfaces, and do not deposit material on dielectric surfaces, such as silicon dioxide or silicon nitride surfaces.

Various sacrificial materials initially positioned on substrate 112 can determine the shape of structures formed in later manufacturing steps. One or more layers of sacrificial material (e.g., sacrificial layers 1102, 1106) may be positioned on substrate 112, and formed by way of deposition, epitaxial growth, and/or any other currently known or later developed procedure of forming a semiconductor material on another semiconductor material. For targeted removal or modification of sacrificial materials with respect to substrate 112 and other semiconductor materials, sacrificial materials may have a different material composition from substrate 112 and other materials (e.g., nanosheets 1104). According to an example, sacrificial materials may include silicon germanium (SiGe) with a predetermined concentration of silicon and germanium therein. As discussed elsewhere herein, sacrificial materials may exhibit a higher germanium concentration relative to other sacrificial materials formed thereon. It is therefore understood that sacrificial materials may generally include a majority-germanium region of SiGe. It is possible in alternative implementations for sacrificial materials to include a majority-silicon region of SiGe, or other semiconductor material.

Figure 12:
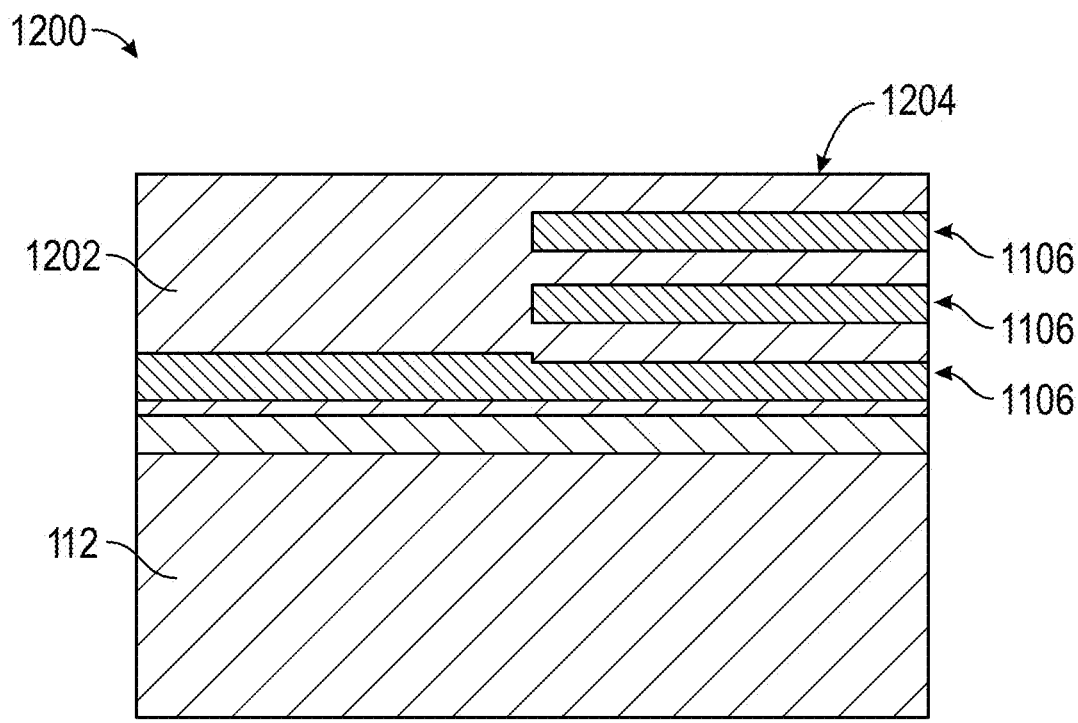
Figure 13:
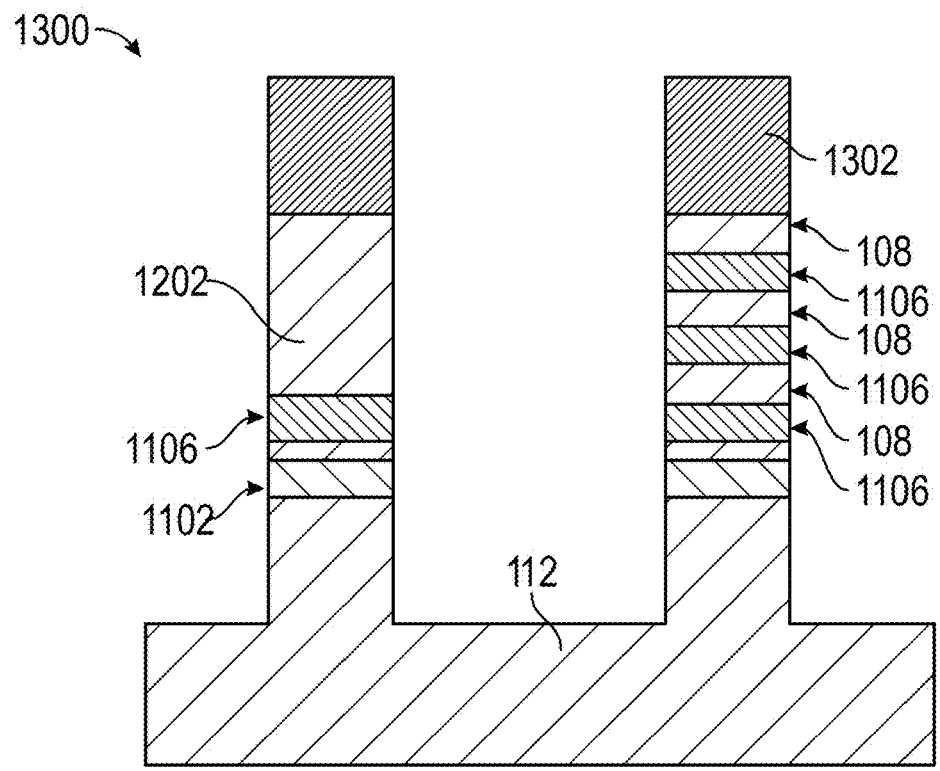
Figure 14:
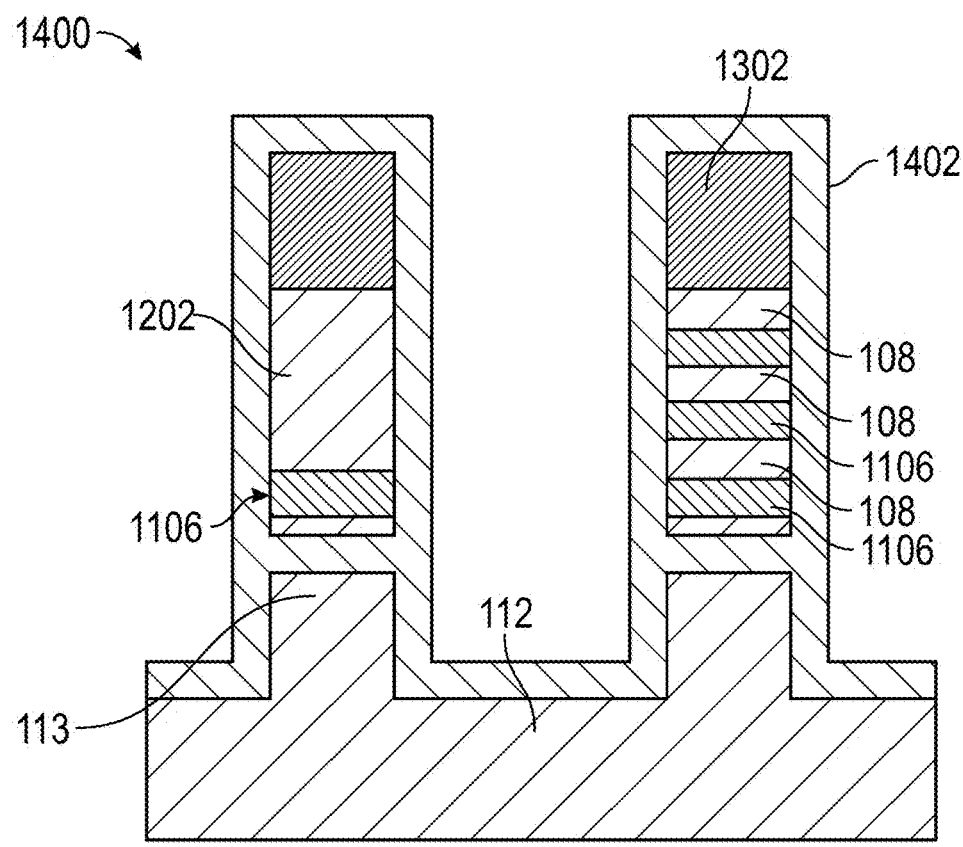
Figure 15:
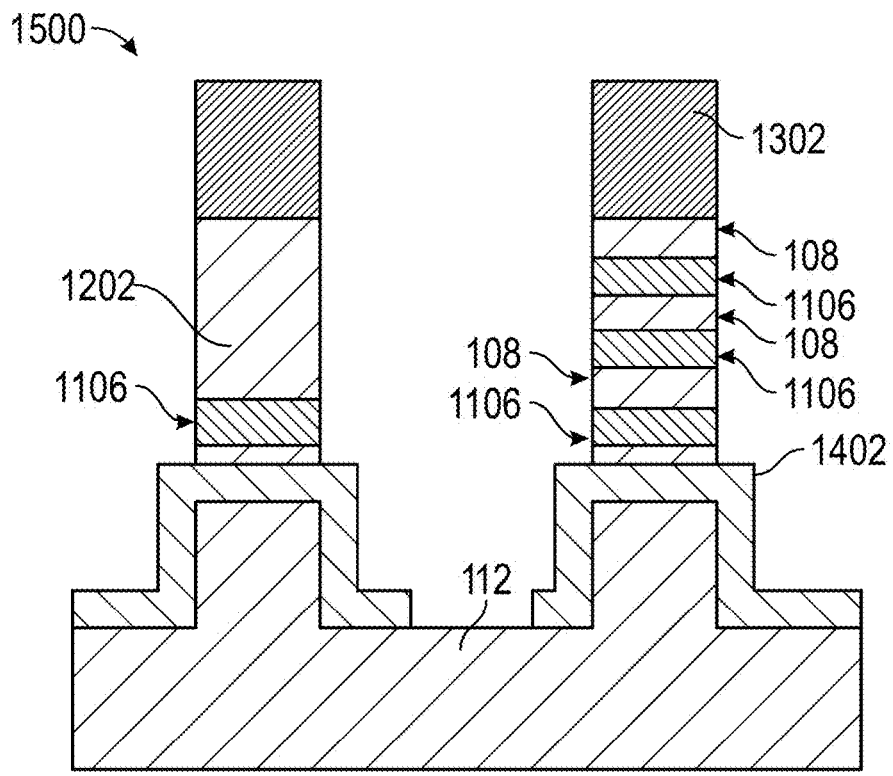
Figure 16:
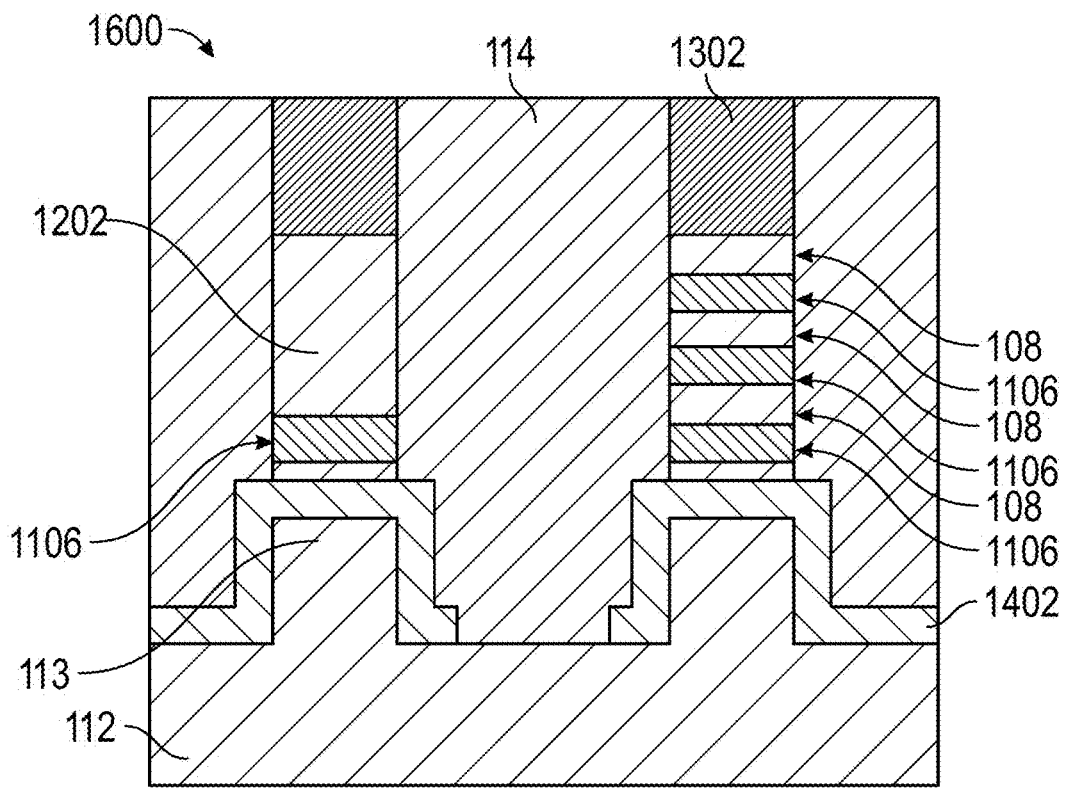
Figure 17:
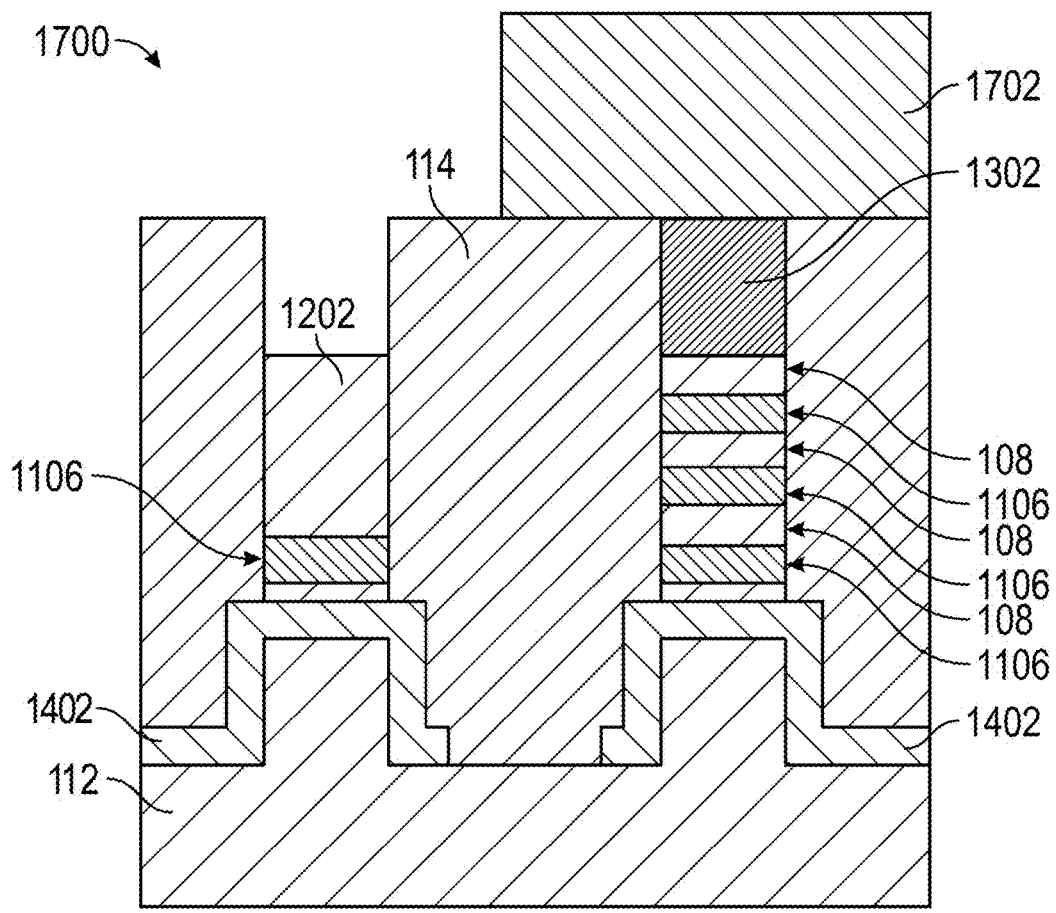

Referring back to FIG. 5, at 504, form an intermediate structure 1200 (as shown in FIG. 12) by first PFET region patterning the precursor structure 1100 to remove a part of the nanosheets 1104 and sacrificial layers 1106, then growing a unitary pFET stack 1202 next to the remaining nFET stack 1204. At 506, form an intermediate structure 1300 (as shown in FIG. 13) by nanosheet patterning with a hard mask 1302. At 508, form an intermediate structure 1400 (as shown in FIG. 14) by depositing a sacrificial material layer 1402 of the same material as the sacrificial layer 1102 (shown in FIG. 11), e.g., SiGe60. At 510, form an intermediate structure 1500 (as shown in FIG. 15) by chamfering, patterning, and removing portions of the sacrificial material layer 1402. At 512, form an intermediate structure 1600 (as shown in FIG. 16) by filling with shallow trench isolation dielectric 114 and chemical-mechanical polishing. At 514, form an intermediate structure 1700 (as shown in FIG. 17) by removing a hard mask 1302 (described below with reference to FIG. 13) from the pFET stack 1202 while protecting the hard mask on the nFET stack 1204 with an encapsulant 1702.

Figure 18:
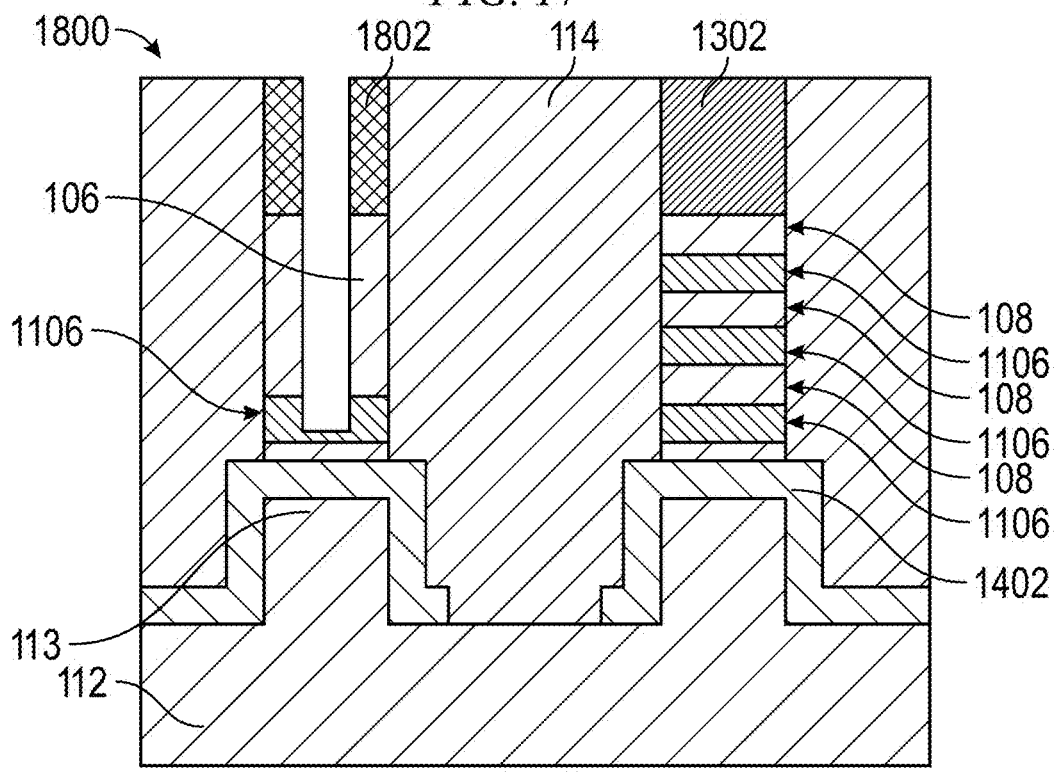
Figure 19:
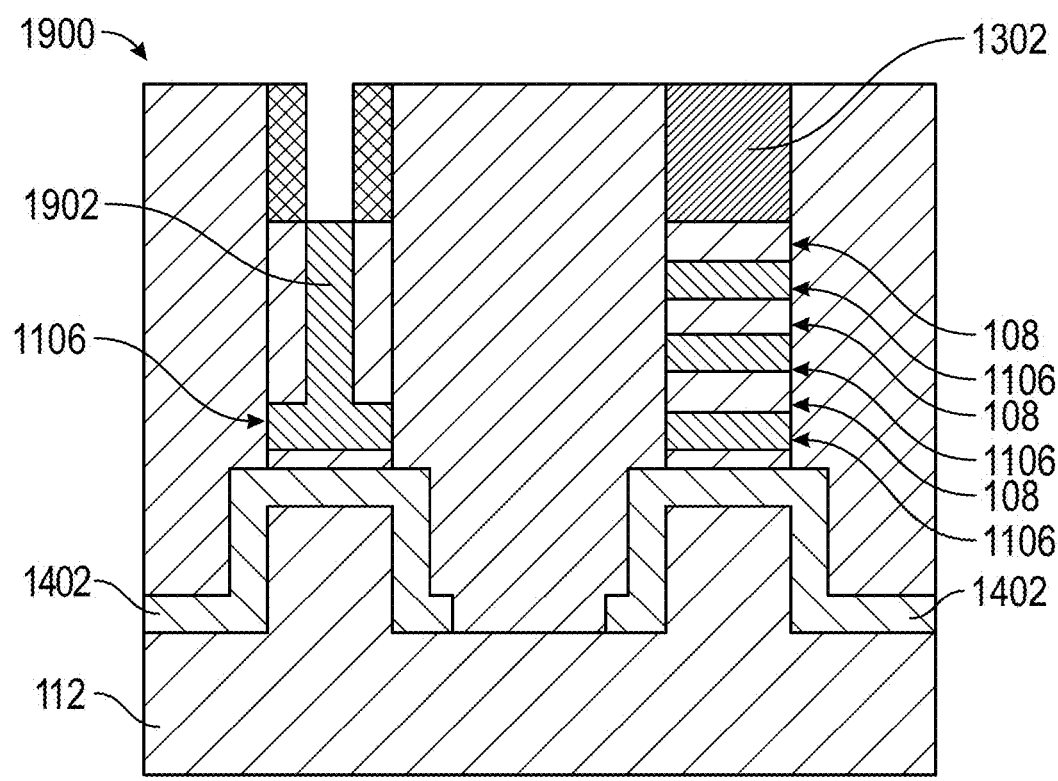
Figure 20:
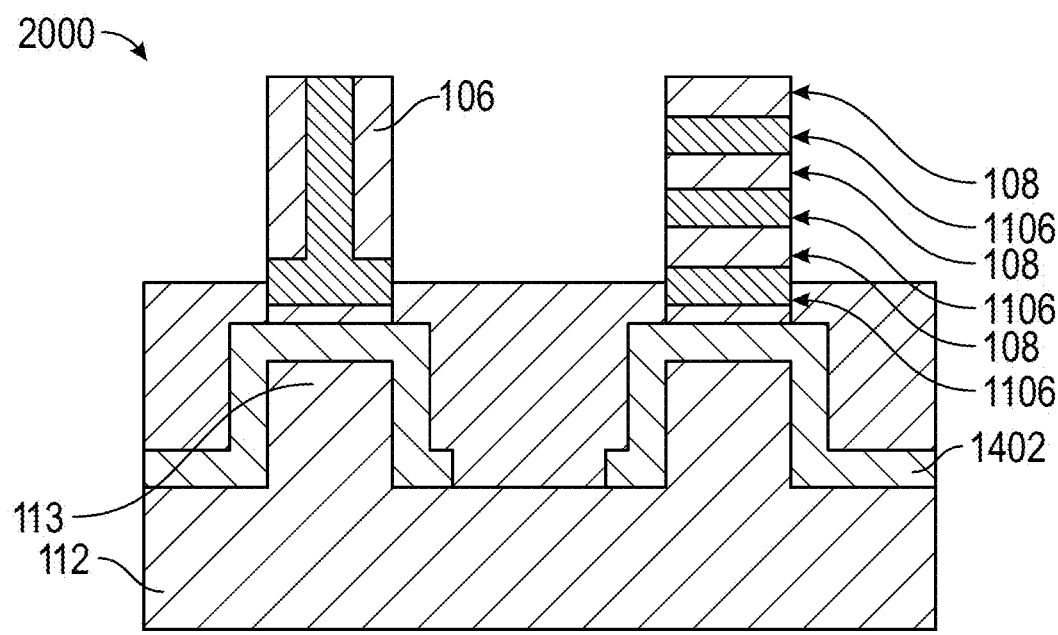
Figure 21:
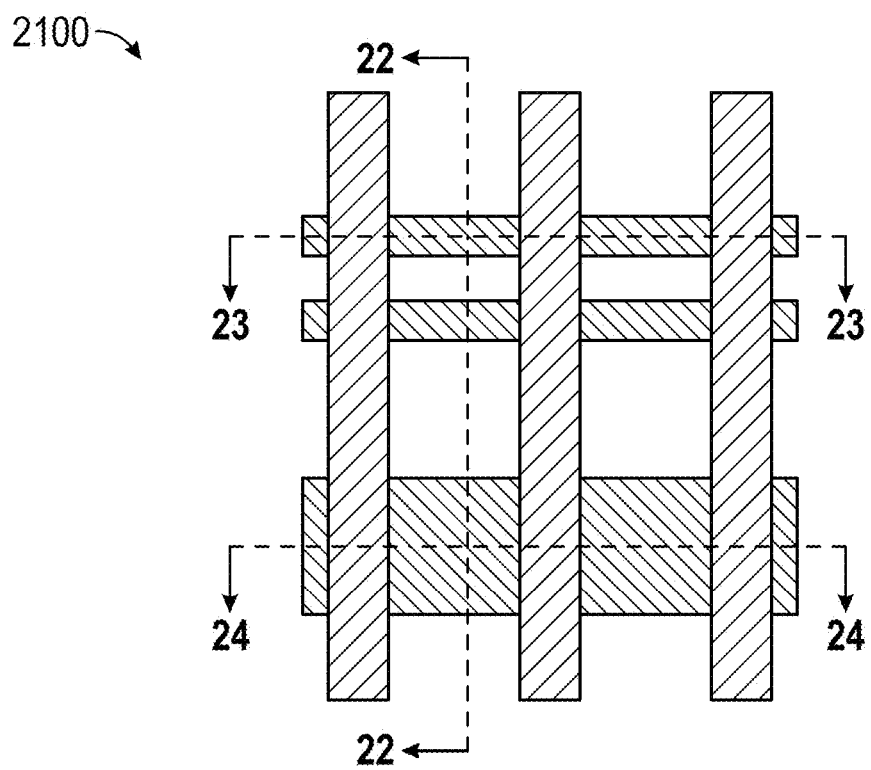
Figure 22:
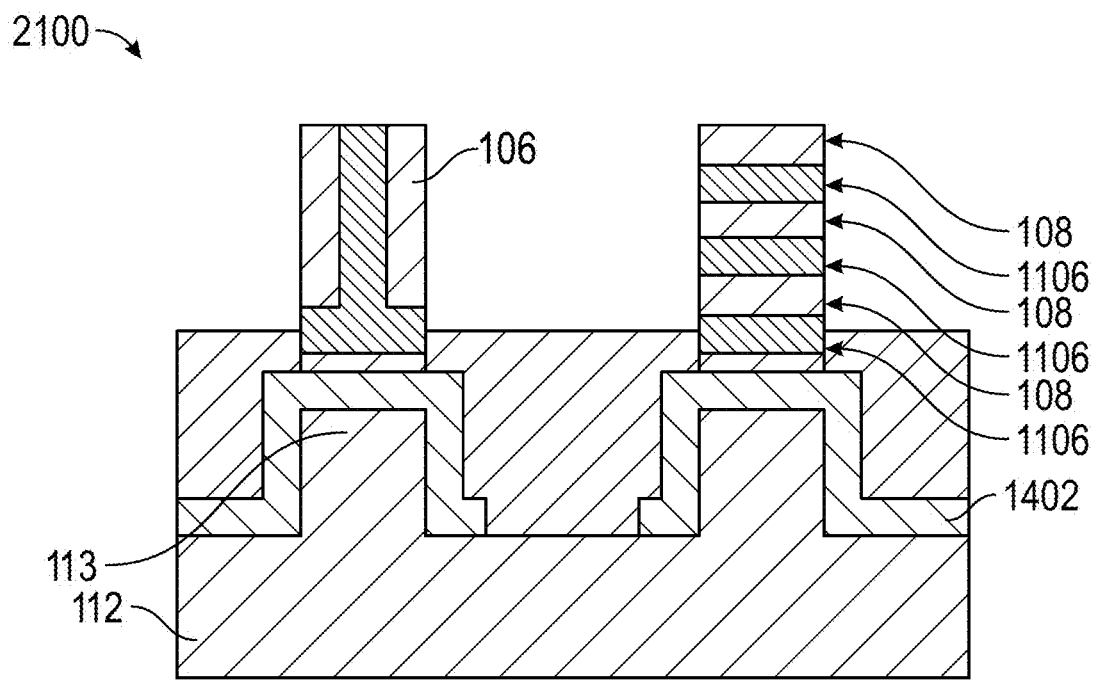
Figure 25:
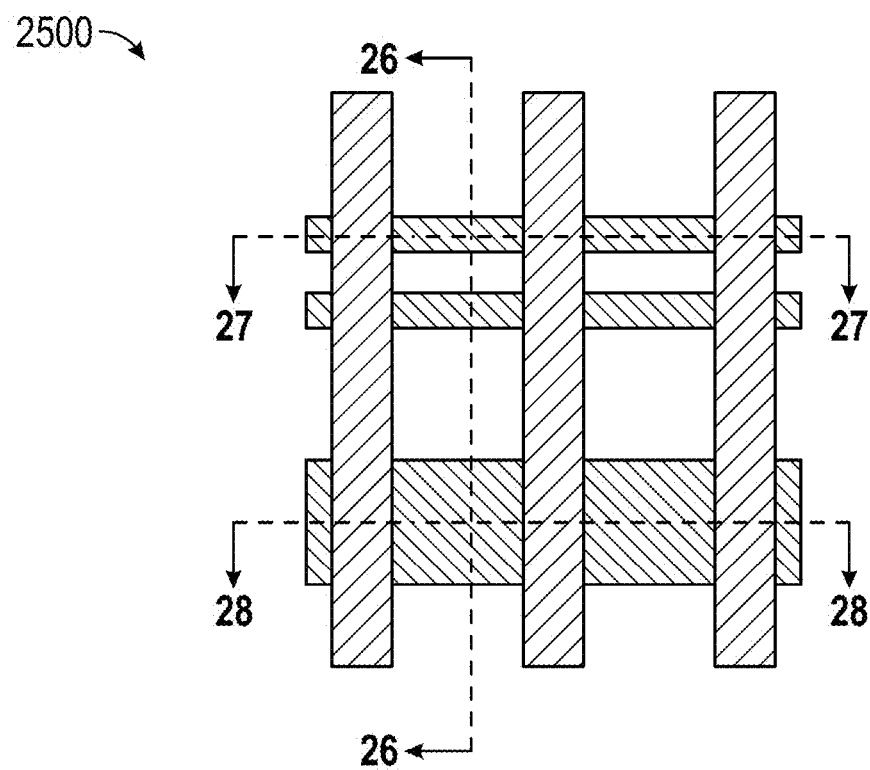
Figure 26:
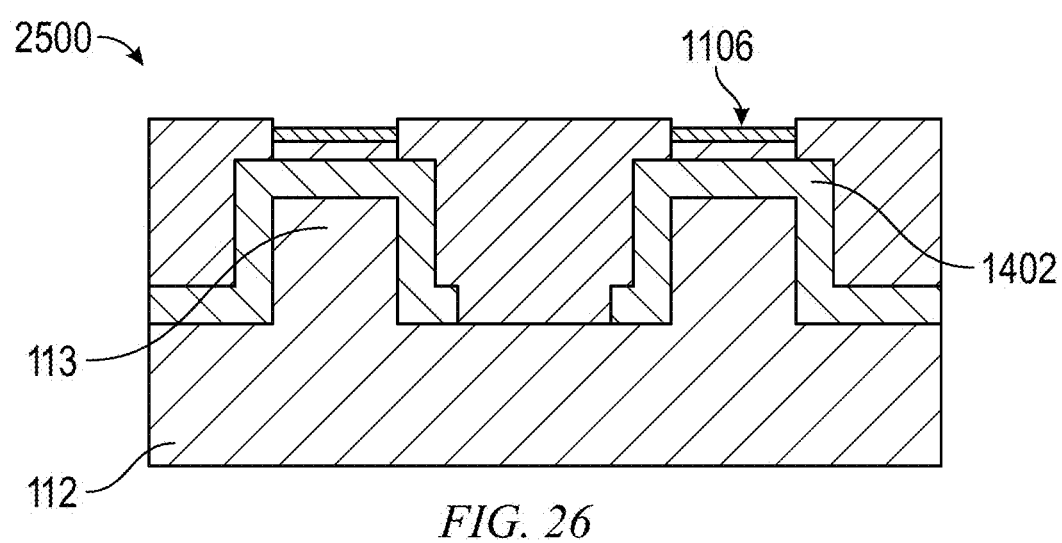
Figures 27, 28:
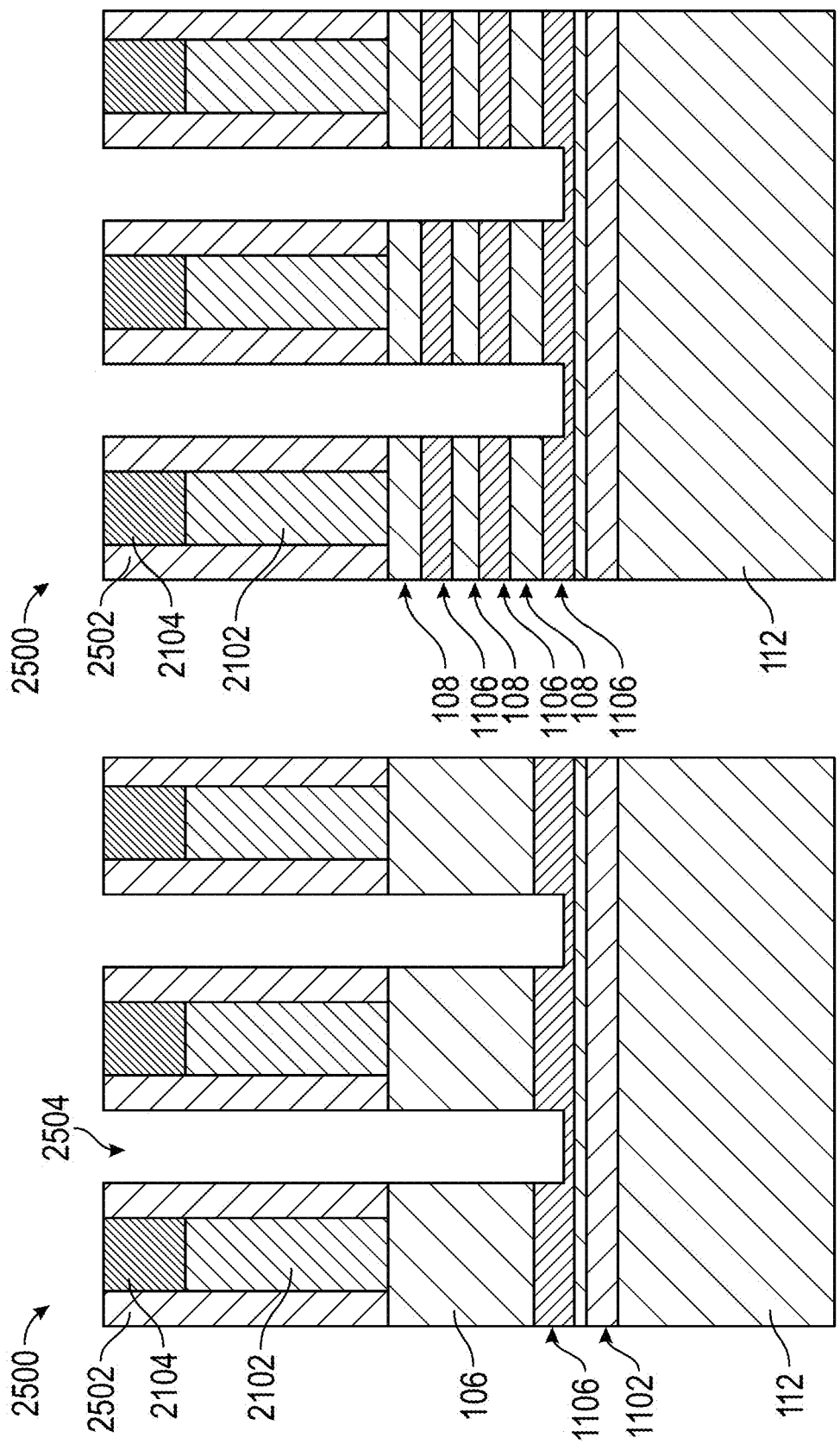
Figure 29:
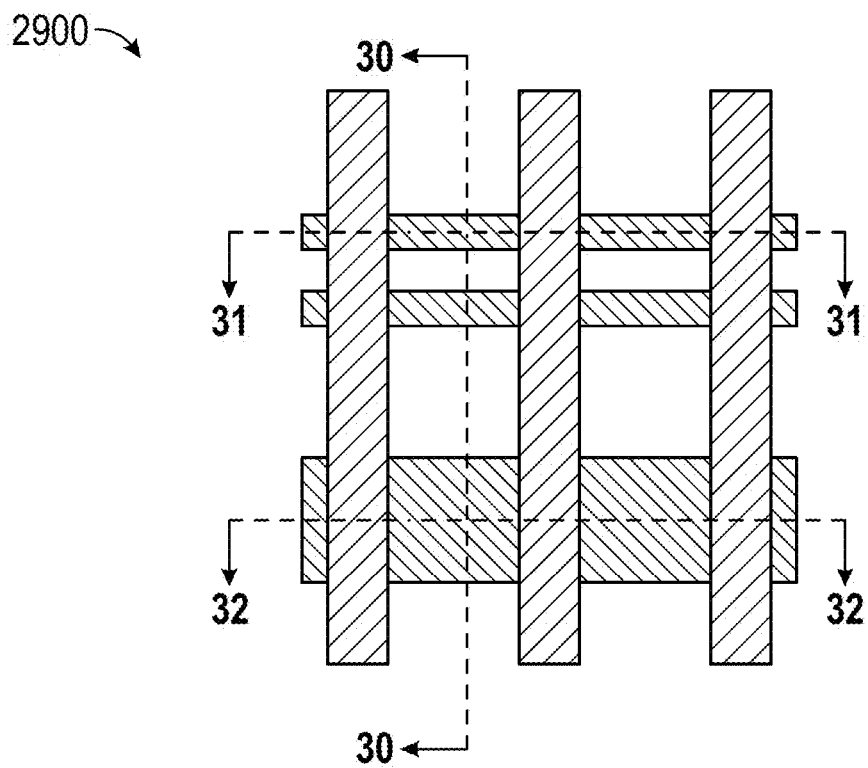
Figure 30:
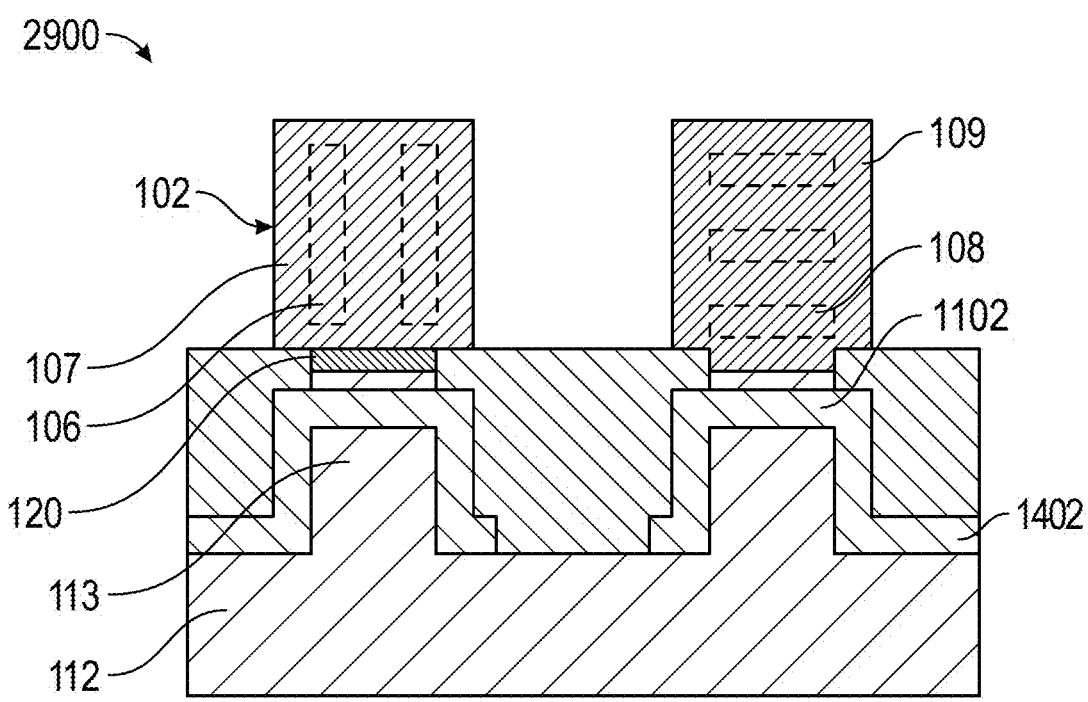
Figures 31, 32:
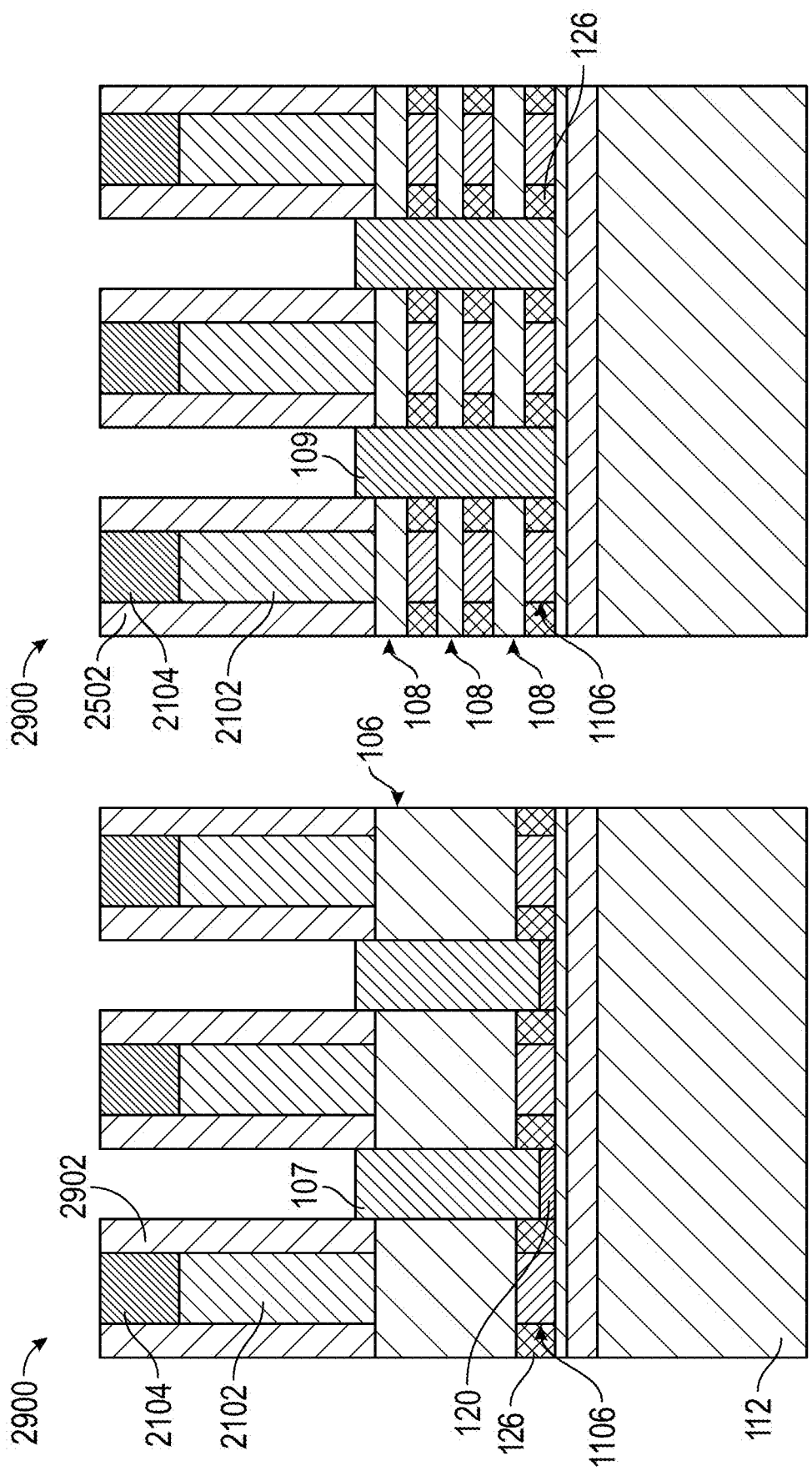
Figure 33:
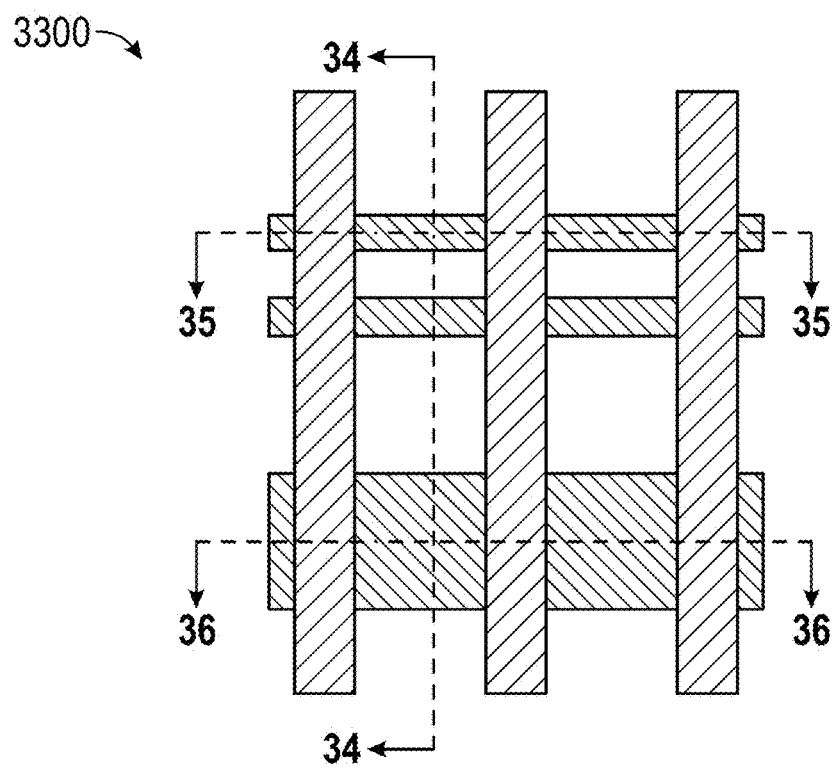
Figure 34:
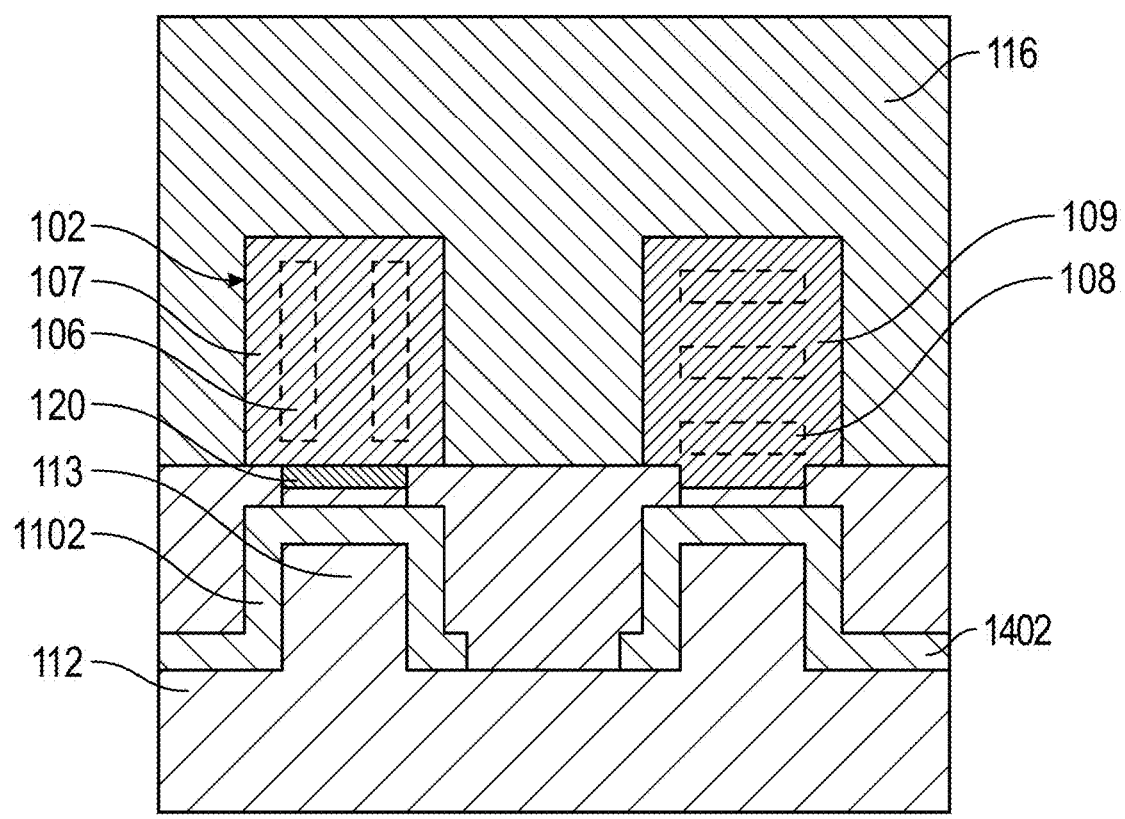
Figures 35, 36:
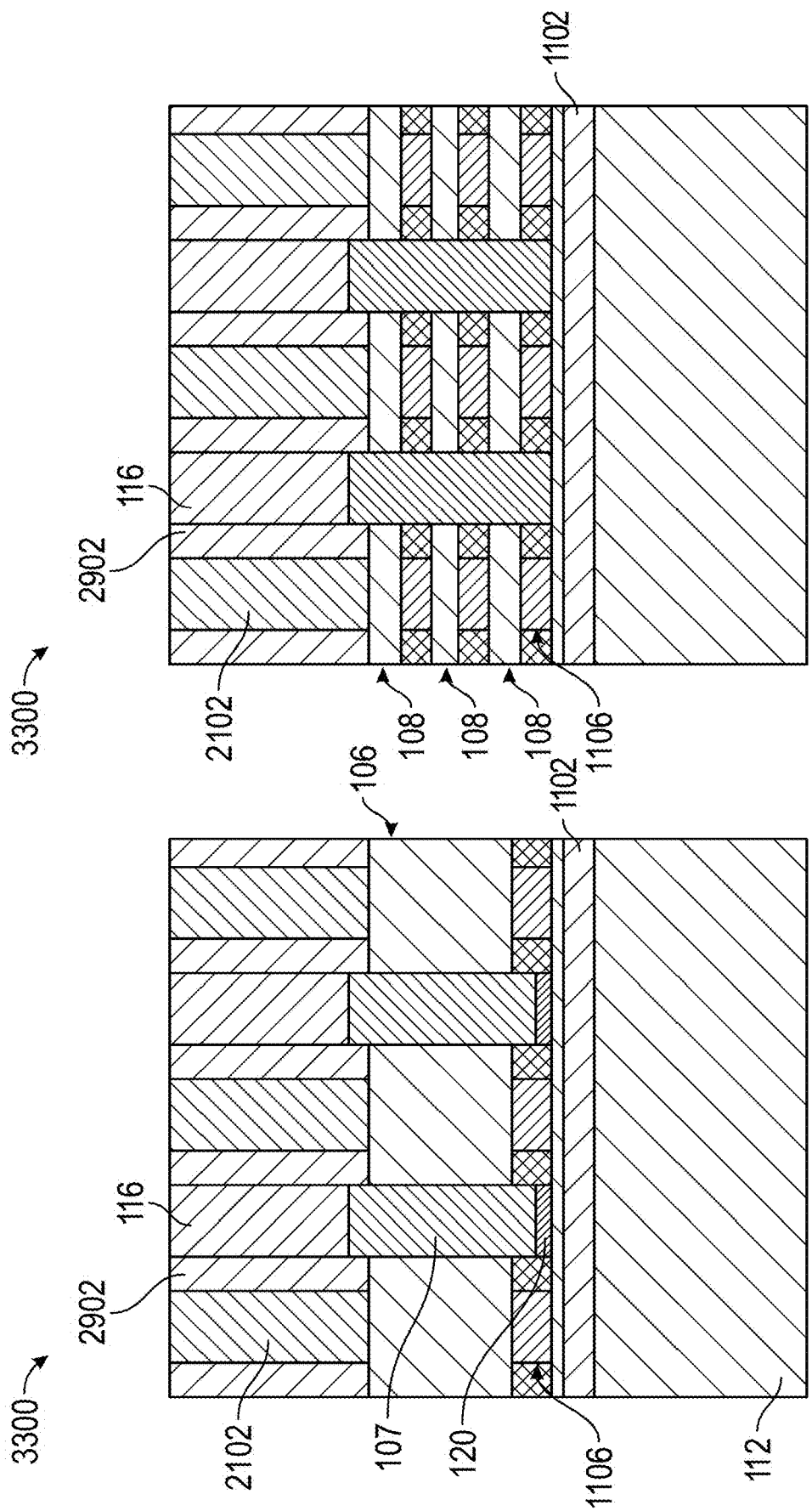
Figure 37:
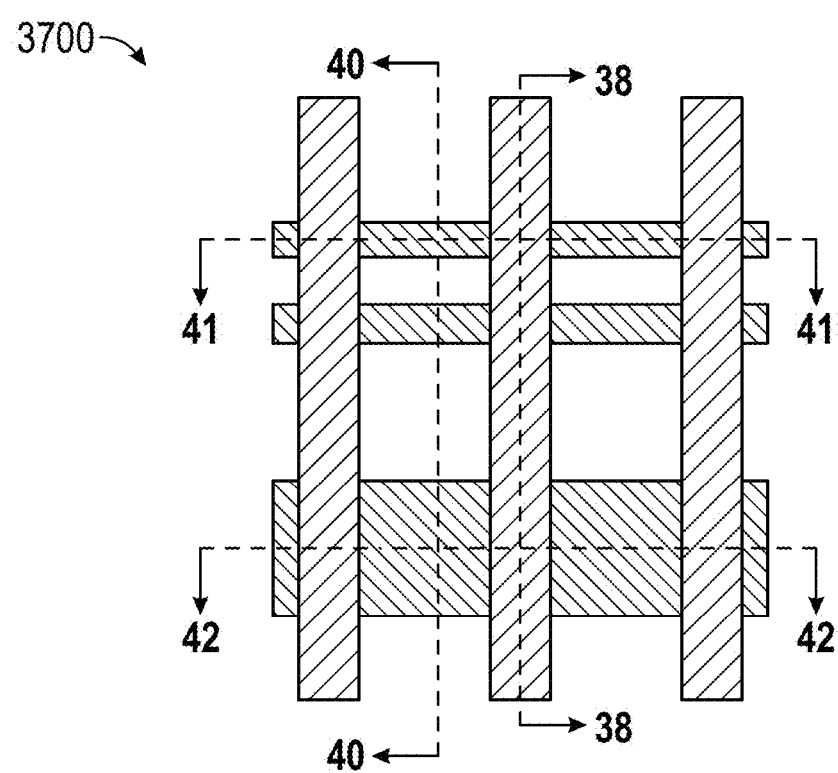
Figure 40:
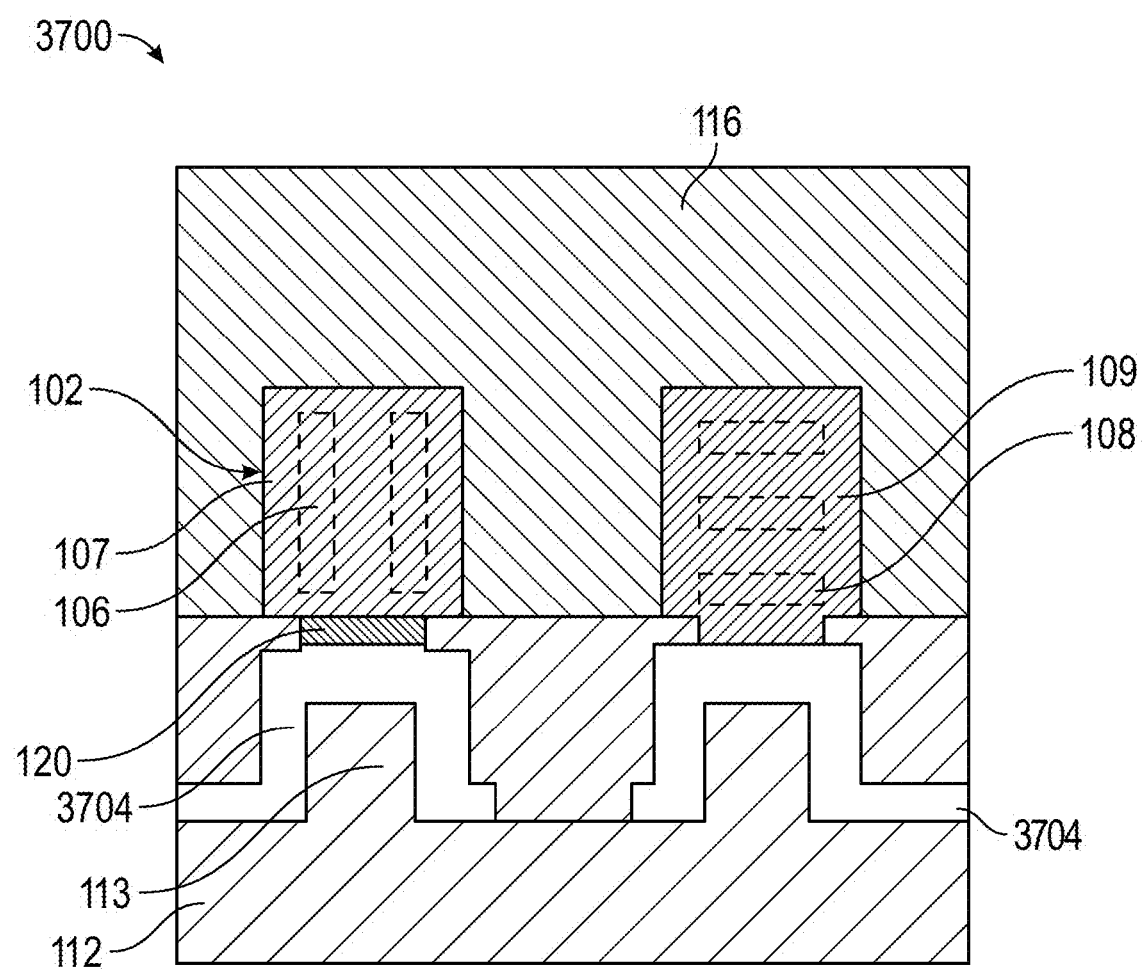
Figures 41, 42:
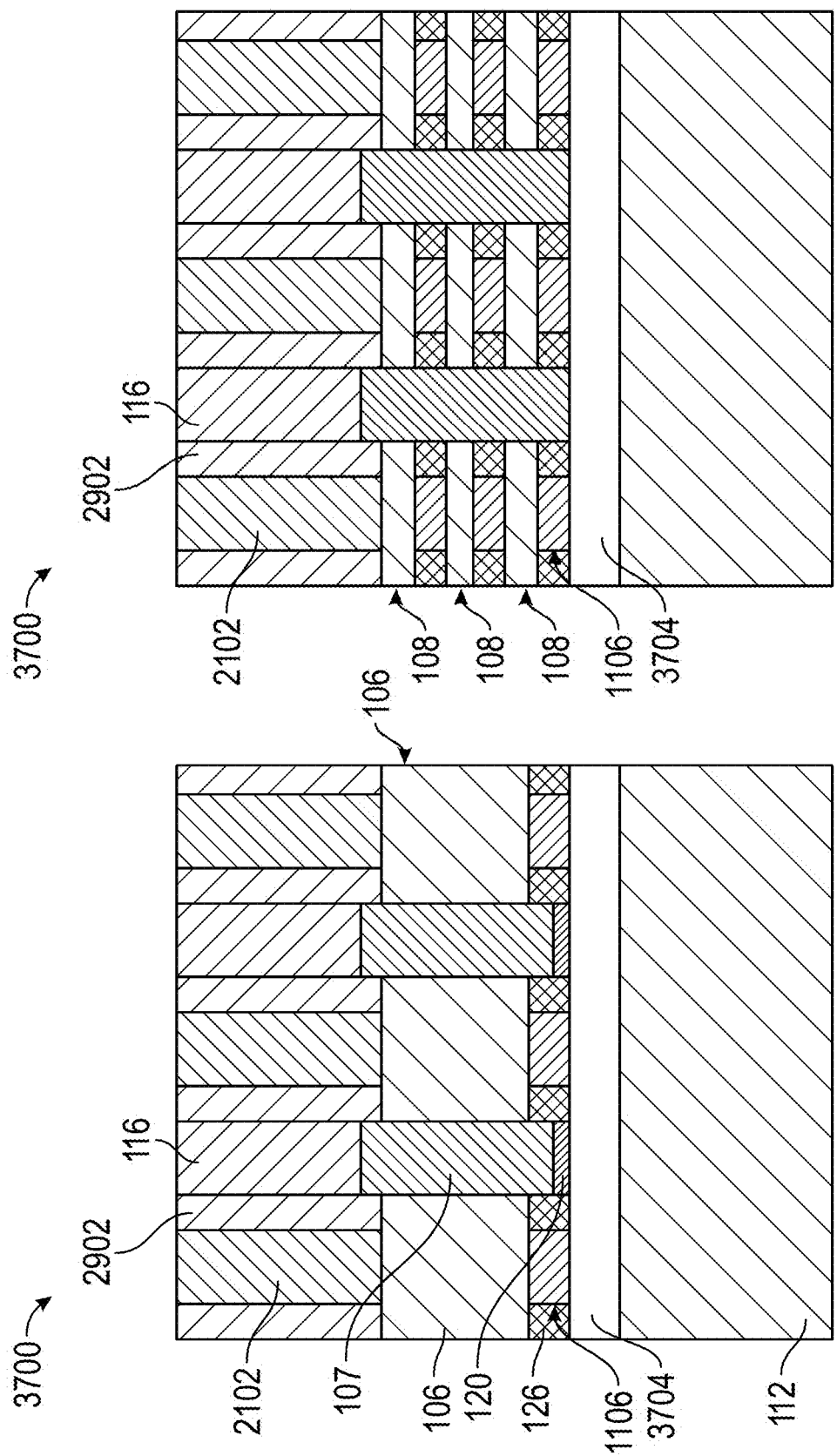

At 516, form an intermediate structure 1800 (as shown in FIG. 18) by forming spacers 1802 and patterning the fins 106. At 518, form an intermediate structure 1900 (as shown in FIG. 19) by filling a sacrificial material 1902, which in one or more embodiments matches the material of sacrificial layers 1106 (described above with reference to FIG. 11). At 520, form an intermediate structure 2000 (as shown in FIG. 20) by etching back the STI dielectric 114 and removing the hard mask 1302 (described above with reference to FIG. 13) to reveal the fins 106 and the nanosheets 108. At 522, form an intermediate structure 2100 (as shown in FIG. 21 through FIG. 24) by forming dummy gates 2102 with hard masks 2104. At 524, form an intermediate structure 2500 (as shown in FIG. 25 through FIG. 28), by forming spacers 2502 and then recessing the fins 106 and nanosheets 108 to form trenches 2504 that will receive source/drain structures in a later step.

Figure 43:
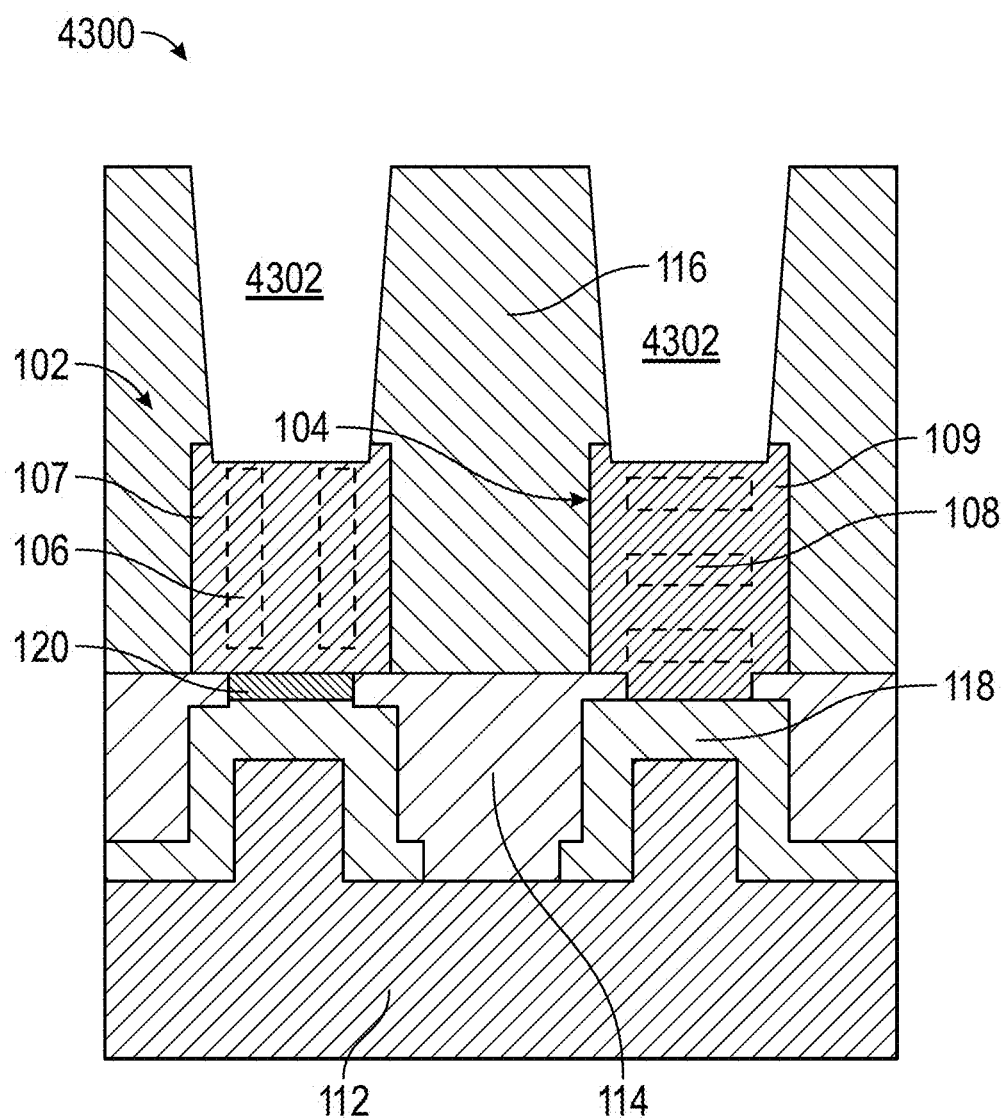

At 526, form an intermediate structure 2900 (as shown in FIG. 29 through FIG. 32) by selective indentation of the sacrificial layers 1106, formation of spacers 2902, and source/drain epitaxial growth (from the bottom surface of the substrate 112). Please note that for NFET source/drain epi 109, the material choice is usually P doped or As doped Si, and it can be directly grown from bottom-most Si layer 1104. For PFET source/drain epi, an Si-buffered epi 120 is grown first over the bottommost Si layer 1104, followed by boron doped SiGe based main epi 107 growth over the Si buffered epi 120. At 528, form an intermediate structure 3300 (as shown in FIG. 33 through FIG. 36) by filling the interlayer dielectric 116 and planarizing (e.g., by chemical-mechanical polishing). At 530, form an intermediate structure 3700 (as shown in FIG. 37 through FIG. 42) by making gate cuts 3702, then selectively etching the sacrificial layer (e.g., SiGe60) 1102 and further doing Si trimming (isotropically etching ~2 nm Si) (last shown in FIG. 34) to form a void 3704. At 532, form an intermediate structure 4300 (as shown in FIG. 43) by filling the gate cuts and the void with the BDI 118, replacing the dummy gates 2102 and the sacrificial material 1106 with the gate stack 110, and etching top contact openings 4302. At 534, form the final structure 100 by filling the top contacts 122, 124 into the top contact openings.

In one or more embodiments, when the p-S/D 107 comprises a silicon germanium alloy, the silicon buffer pad 120 advantageously protects the p-S/D 107 from selective etching of the sacrificial layer 1102 (which, in such embodiments, comprises a silicon germanium alloy such as SiGe60).

Figure 6:
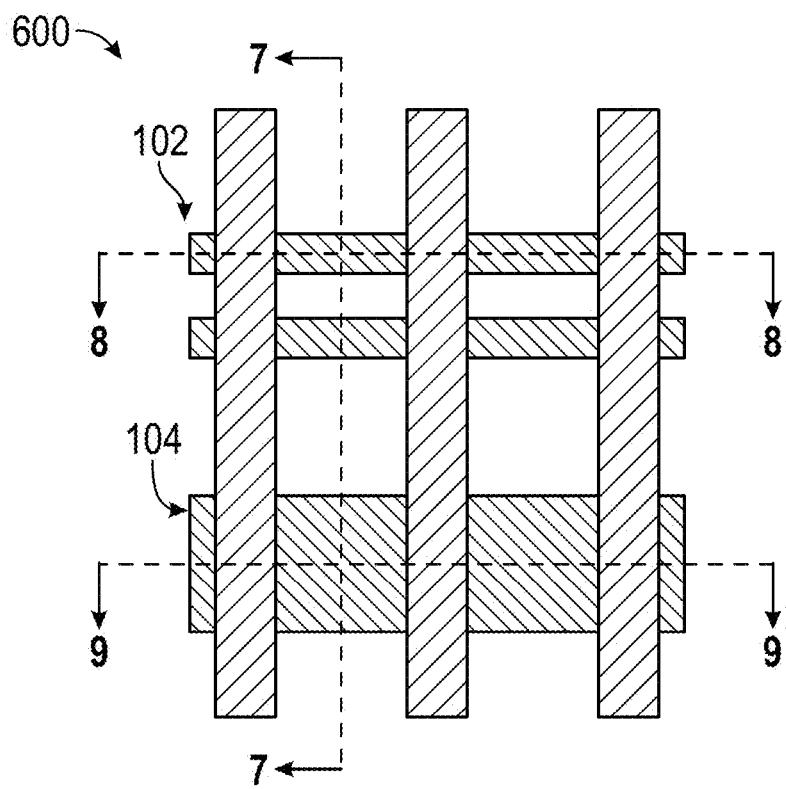
FIG. 6 depicts in a plan view a hybrid nanosheet structure that includes a vertical-pFET (p-type field effect transistor) and a horizontal-nFET (n-type field effect transistor), according to exemplary embodiments.
Figure 7:
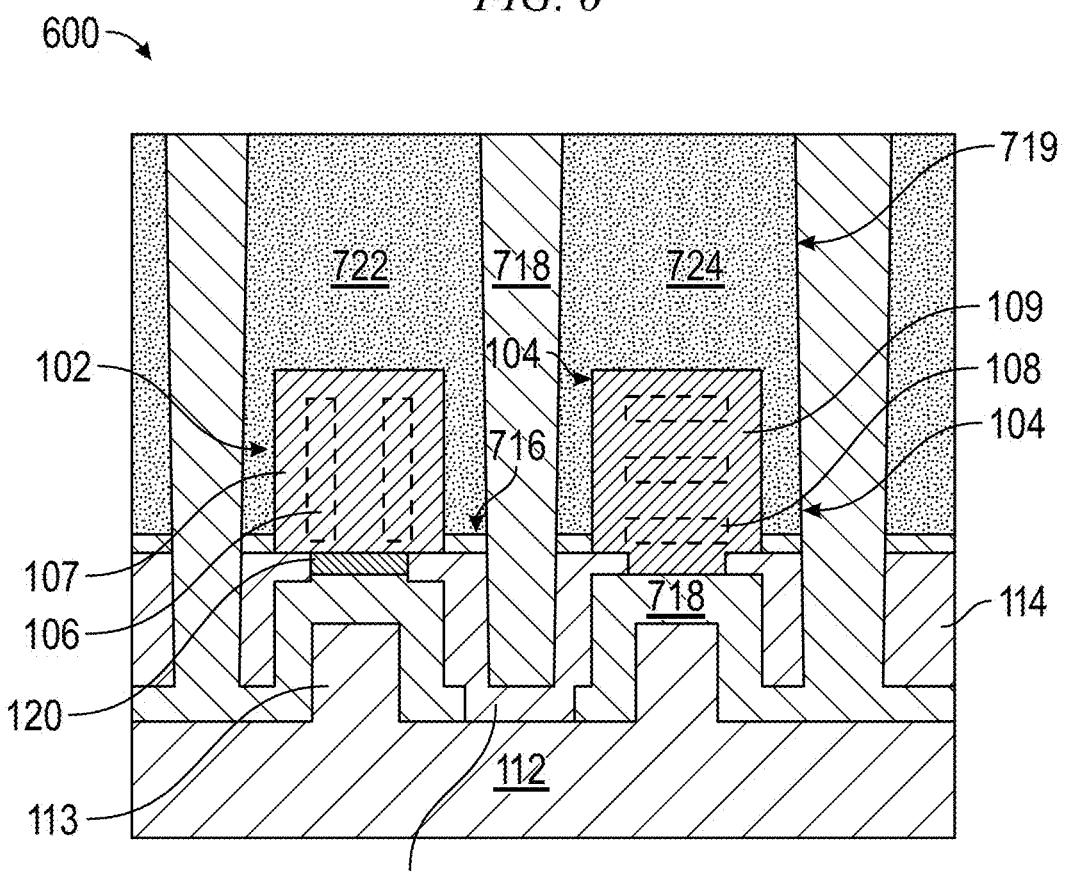
FIG. 7 depicts in a section view the hybrid nanosheet structure shown in FIG. 6, as seen at cutline 7-7.
Figure 8:
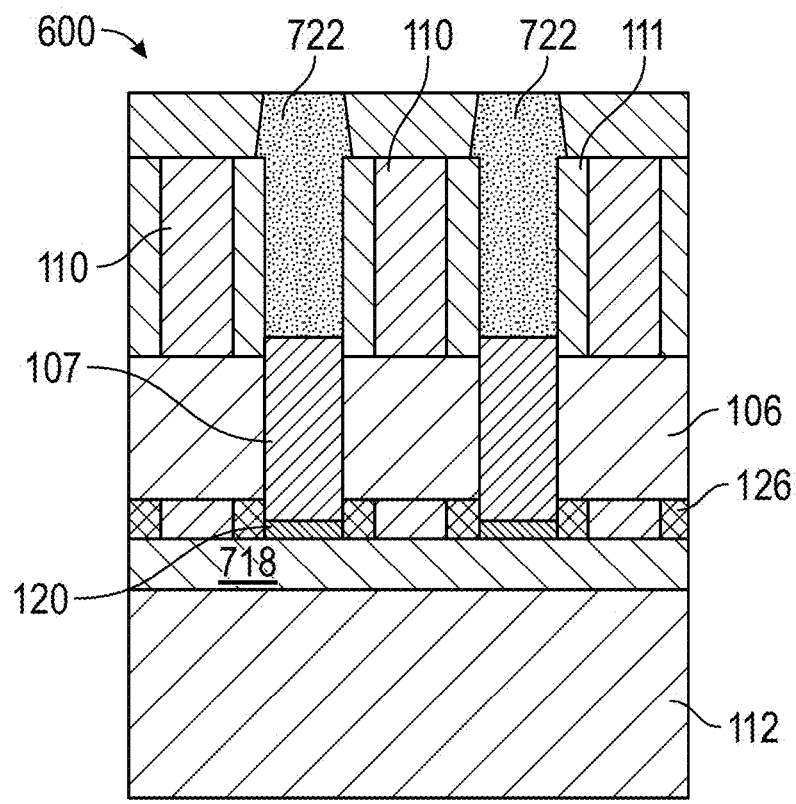
FIG. 8 depicts in a section view the hybrid nanosheet structure shown in FIG. 6, as seen at cutline 8-8.
Figure 9:
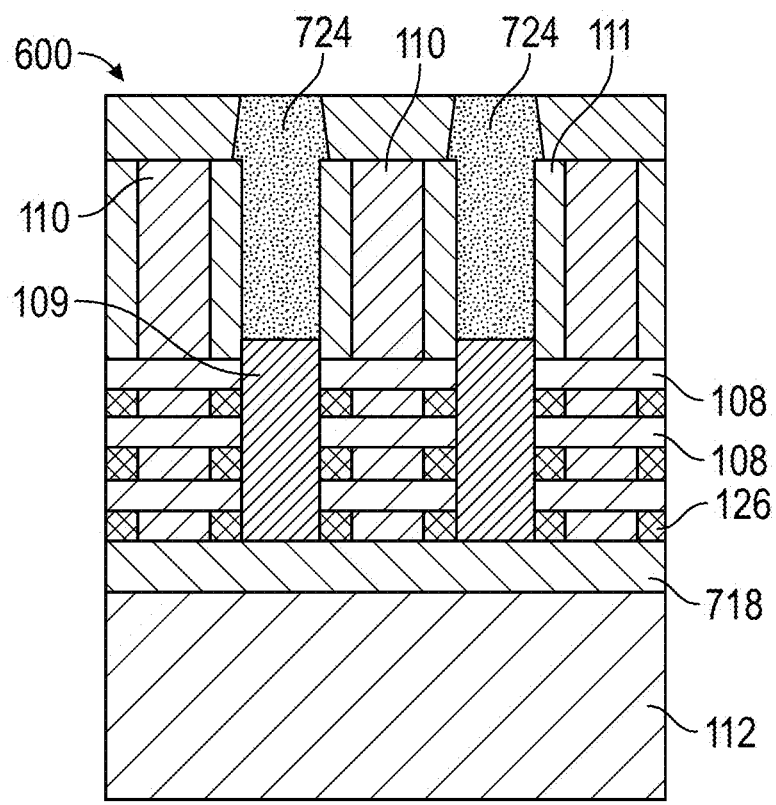
FIG. 9 depicts in a section view the hybrid nanosheet structure shown in FIG. 6, as seen at cutline 9-9.

FIG. 6 depicts in a plan view a hybrid nanosheet structure 600 that includes a vertical-pFET (p-type field effect transistor) 102 and a horizontal-nFET (n-type field effect transistor) 104, according to exemplary embodiments. FIG. 7 depicts in a section view the hybrid nanosheet structure 600 shown in FIG. 6, as seen at cutline 7-7. FIG. 8 depicts in a section view the hybrid nanosheet structure 600 shown in FIG. 6, as seen at cutline 8-8. FIG. 9 depicts in a section view the hybrid nanosheet structure 600 shown in FIG. 6, as seen at cutline 9-9.

The structure 600 includes components similar to those of the structure 100. These similar components are similarly numbered in FIG. 6 through FIG. 9 as they were in FIG. 1 through FIG. 4, and detailed description of such similar components is not repeated here. The structure 600 differs from the structure 100 in that: the top contacts 722, 724 are differently shaped than the top contacts 122, 124; the interlayer dielectric 716 is thinner than the interlayer dielectric 116; and the bottom dielectric insulation 718 extends through source/drain contact cuts 719.

Figure 10:
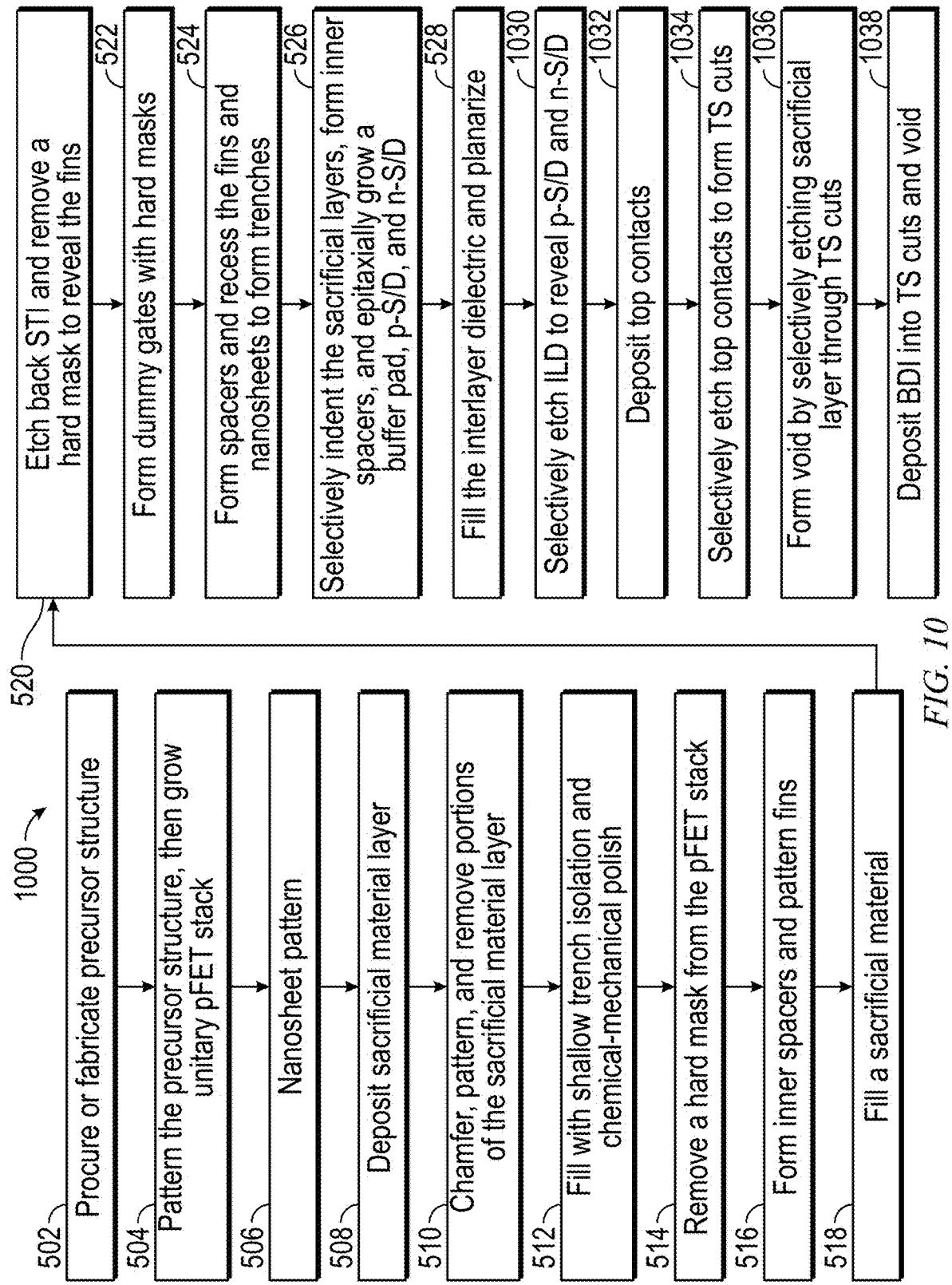
FIG. 10 depicts steps of a method for fabricating the structure shown in FIG. 6.

FIG. 10 depicts steps of a method 1000 for fabricating the structure shown in FIG. 6. The skilled worker will appreciate that most steps of the method 1000 are identical to those of the method 500, and detailed descriptions thereof are not repeated here. However, the method 1000 differs at step 1030, wherein the interlayer dielectric 716 is selectively etched to reveal the p-S/D and n-S/D before step 1032 of depositing top contacts 722, 724 (as shown in FIG. 7). Further, the method 1000 includes a step 1034 of selectively etching the top contacts 722, 724 to form the source/drain cuts 719; a step 1036 of forming a void by selectively etching the sacrificial layer 1102 through the source/drain contact cuts; and a step 1038 of forming the final structure 600 by depositing the BDI 718 into the void and into the source/drain cuts 719.

Given the discussion thus far, it will be appreciated that, in general terms, an exemplary semiconductor apparatus 100, according to exemplary embodiments, includes a substrate that includes a first semiconductor. The substrate includes a main body 112 and first and second island portions 113 protruding upward from the main body. The apparatus also includes a bottom dielectric isolation layer 118 that covers the substrate; a PFET 102 with a plurality of gate-all-around (GAA) vertical channel fins 106 above the first island portion and the bottom dielectric isolation layer; and an NFET 104 with a plurality of gate-all-around (GAA) horizontal nanosheet layers 108 above the second island portion and the bottom dielectric isolation layer.

In one or more embodiments, the apparatus also includes a first source/drain structure 107, associated with the PFET 102. The first source/drain structure is above the bottom dielectric isolation layer and includes a second semiconductor. A silicon buffer layer 120 is formed between the dielectric isolation layer and the first source/drain structure. In one or more embodiments, the apparatus also includes a second source/drain structure 109, associated with the NFET 104. The second source/drain structure 109 is formed directly above the bottom dielectric isolation layer.

In one or more embodiments, the bottom dielectric isolation layer covers a top surface and sidewalls of the island portion of the substrate. In one or more embodiments, the bottom dielectric isolation layer is connected to a gate cut region. In one or more embodiments, the bottom dielectric isolation layer is connected to source/drain contact cuts.

In one or more embodiments, the PFET fin sidewalls have a (110) surface orientation. In one or more embodiments, the NFET nanosheet top and bottom surfaces have a (100) surface orientation.

According to another aspect, an exemplary semiconductor apparatus includes a substrate that includes a first semiconductor. The substrate includes a main body 112 and an island portion 113 protruding upward from the main body. The apparatus also includes a bottom dielectric isolation layer 118 overlying the substrate; and a first source/drain structure 107 above the bottom dielectric isolation layer. The first source/drain structure includes a second semiconductor, which has a same crystal structure and orientation as the island portion of the substrate.

In one or more embodiments, the first source/drain structure rests on a silicon buffer above the bottom dielectric isolation layer.

In one or more embodiments, the bottom dielectric isolation layer covers a top surface and sidewalls of the island portion of the substrate.

In one or more embodiments, the second semiconductor includes a silicon-germanium alloy. In one or more embodiments, the second semiconductor is doped with boron.

In one or more embodiments, the first semiconductor includes silicon; the first source/drain structure has a face-centered diamond-cubic crystal structure; and the first source/drain structure has a (100) crystal orientation.

According to another aspect, an exemplary method 500 for making a semiconductor structure includes, at 502, epitaxially growing a stack of nanosheets of a first semiconductor, interleaved with a first sacrificial material, from a layer of a second sacrificial material that covers a second semiconductor substrate. The exemplary method also includes, at 504, patterning the stack of nanosheets to reveal a region of the second sacrificial material and epitaxially growing a PFET stack of a second semiconductor from the region of the second sacrificial material. Then at 516, form, from the PFET stack, vertical PFET fins that are separated by the first sacrificial material from each other and from a base layer of the first semiconductor. At 522, form a dummy gate around the PFET fins. At 526, form inner spacers by indenting the first sacrificial material, epitaxially grow a silicon buffer, using the base layer as nucleation, and epitaxially grow, from the silicon buffer, a source/drain structure (p-S/D), which contacts ends of the PFET fins. At 530 and 532, replace the second sacrificial material with a bottom dielectric isolator.

In one or more embodiments, the method also includes replacing the dummy gate with a high-k/metal gate stack.

In one or more embodiments, replacing the first sacrificial material with the bottom dielectric isolator includes selectively etching the first sacrificial material through a cut made in the dummy gate.

In one or more embodiments, the first semiconductor includes silicon. In one or more embodiments, the first sacrificial material includes silicon-germanium-30%. In one or more embodiments, the second sacrificial material includes silicon-germanium-60%.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor apparatus comprising:
a substrate comprising a first semiconductor, wherein the substrate comprises a main body and first and second island portions protruding upward from the main body;
a bottom dielectric isolation layer that covers at least top surfaces and sidewalls of the first and second island portions of the substrate;
a PFET with a plurality of gate-all-around (GAA) vertical channel fins above the first island portion and the bottom dielectric isolation layer;
an NFET with a plurality of gate-all-around (GAA) horizontal nanosheet layers above the second island portion and the bottom dielectric isolation layer;
a first source/drain structure, associated with the PFET, wherein the first source/drain structure is above the bottom dielectric isolation layer and comprises a second semiconductor, wherein a silicon buffer layer is formed between the dielectric isolation layer and the first source/drain structure; and a second source/drain structure, associated with the NFET, wherein the second source/drain structure is formed directly above the bottom dielectric isolation layer;

wherein, when viewed in a cross-channel cross section:
the first and second island portions are unitary;
a combined width of the first island portion and the bottom dielectric isolation layer on the sidewalls thereof is wider than a distance between left- and right-most sides of the gate-all-around (GAA) vertical channel fins; and
a combined width of the second island portion and the bottom dielectric isolation layer on the sidewalls thereof is wider than a width of the gate-all-around (GAA) horizontal nanosheet layers.

2. The apparatus of claim 1, wherein the bottom dielectric isolation layer is connected to a gate cut region.

3. The apparatus of claim 1, wherein the bottom dielectric isolation layer is connected to source/drain contact cuts.

4. The apparatus of claim 1, wherein the PFET fin sidewalls have a (110) surface orientation.

5. The apparatus of claim 1, wherein the NFET nanosheet top and bottom surfaces have a (100) surface orientation.

6. A semiconductor apparatus comprising:
a substrate comprising a first semiconductor, wherein the substrate comprises a main body and an island portion protruding upward from the main body;
a bottom dielectric isolation layer that covers at least a top surface and sidewalls of the island portion of the substrate;
a first source/drain structure above the bottom dielectric isolation layer and comprising a second semiconductor, wherein the first source/drain structure has a same crystal structure and orientation as the island portion of the substrate;
a plurality of gate-all-around (GAA) vertical channel fins above the island portion and the bottom dielectric isolation layer and associated with the first source/drain structure;

wherein, when viewed in a cross-channel cross section:
the island portion is unitary; and
a combined width of the island portion and the bottom dielectric isolation layer on the sidewalls thereof is wider than a distance between left- and right-most sides of the gate-all-around (GAA) vertical channel fins.

7. The apparatus of claim 6, wherein the first source/drain structure rests on a silicon buffer above the bottom dielectric isolation layer.

8. The apparatus of claim 6, wherein the second semiconductor comprises a silicon-germanium alloy.

9. The apparatus of claim 6, wherein the second semiconductor is doped with boron.

10. The apparatus of claim 6, wherein: the first semiconductor comprises silicon; the first source/drain structure has a face-centered diamond-cubic crystal structure; and the first source/drain structure has a (100) crystal orientation.

* * * * *